United States Patent [19]

Sasaki

[11] Patent Number: 4,471,525
[45] Date of Patent: Sep. 18, 1984

[54] METHOD FOR MANUFACTURING SEMICONDUCTOR DEVICE UTILIZING TWO-STEP ETCH AND SELECTIVE OXIDATION TO FORM ISOLATION REGIONS

[75] Inventor: Yoshitaka Sasaki, Yokohama, Japan

[73] Assignee: Tokyo Shibaura Denki Kabushiki Kaisha, Japan

[21] Appl. No.: 359,485

[22] Filed: Mar. 18, 1982

[30] Foreign Application Priority Data

Mar. 20, 1981 [JP] Japan .................. 56-41555
Mar. 20, 1981 [JP] Japan .................. 56-41558
Sep. 24, 1981 [JP] Japan .................. 56-151278
Sep. 30, 1981 [JP] Japan .................. 56-155198

[51] Int. Cl.³ .................. H01L 21/31; H01L 21/76
[52] U.S. Cl. .................. 29/576 W; 29/578;
29/580; 148/174; 148/175; 156/643; 156/649;
156/653; 156/657; 357/49; 357/50
[58] Field of Search .................. 29/576 W, 578, 580;
148/174, 175; 156/643, 649, 653, 657; 357/49, 50

[56] References Cited

U.S. PATENT DOCUMENTS 4,222,792  9/1980  Lever et al. .................. 148/1.5
4,238,278  12/1980  Antipov .................. 29/576 W X
4,356,211  10/1982  Riseman .................. 29/576 W X

FOREIGN PATENT DOCUMENTS 20994  1/1981  European Pat. Off. .
56-4245  1/1981  Japan .

OTHER PUBLICATIONS

Patent Abstracts of Japan, vol. 3, No. 38, Mar. 30, 1979, p. 45E101, JP-A-54-16189.
Patent Abstracts of Japan, vol. 3, No. 22, Feb. 24, 1979, p. 35E93 JP-A-54-589.
IMB Tech. Discl. Bull. vol. 22, No. 11, Apr. 1980, N.Y., R. D. Isaac "Fabrication Process for Full ROX Isolation without a Bird's Beak" pp. 5148 to 5151, *p. 5150, third to fifth paragraphs.
IBM Technical Disclosure Bulletin, vol. 20, No. 1, Jun. 1977, pp. 144–145 "Recessed Oxide Isolation Process" by S. A. Abbas.
IBM Technical Disclosure Bulletin, vol. 22, No. 7, Dec. 1979, pp. 2749–2750, "Self-aligned Recessed Oxide..." by C. E. Benjamin.
Kenney, D. M., "Self–aligned U–Groove . . ." IBM Tech. Discl. Bull., vol. 22, No. 10, Mar. 1980, pp. 4448–4449.

Primary Examiner—William G. Saba
Attorney, Agent, or Firm—Finnegan Henderson Farabow Garrett & Dunner

[57] ABSTRACT

Disclosed is a method for manufacturing a semiconductor device of high reliability, high performance and high integration with high yield. The method of this invention has the steps of forming at least one groove in a semiconductor substrate, forming a non-single-crystalline semiconductor film to cover an entire surface of the semiconductor substrate including an inner surface of the groove, selectively etching the non-single-crystalline semiconductor film so as to leave the non-single-crystalline semiconductor film on at least a side wall of the groove, and forming an oxide isolation layer in the groove by thermal oxidation.

9 Claims, 58 Drawing Figures

METHOD FOR MANUFACTURING SEMICONDUCTOR DEVICE UTILIZING TWO-STEP ETCH AND SELECTIVE OXIDATION TO FORM ISOLATION REGIONS

BACKGROUND OF THE INVENTION

The present invention relates to a method for manufacturing a semiconductor device and, more particularly, to an improved method for forming an isolation region.

Since the capacity of semiconductor integrated circuits has been increased and their functions have been varied, semiconductor integrated circuits tend to be made in larger scale. In accordance with the large integration of the circuits, it is desired that the dimensions of semiconductor elements be minimized. The size of the elements is required to be 3 μm, 2 μm and even on the order of submicrons.

A common technique for minimizing the element size is to isolate the elements by a dielectric material. A selective oxidation technique as one of the techniques for this purpose has been conventionally adopted.

A process for forming an isolation region by the selective oxidation technique in the process for manufacturing an npn bipolar type integrated circuit will be described with reference to FIGS. 1A to 1C.

(I) Referring to FIG. 1A, an n+-type buried layer 2 is selectively formed on one major surface of a p-type silicon substrate 1. Thereafter, an n-type silicon epitaxial layer 3 is grown thereon. An oxide film 4 is then formed on the surface of the n-type silicon epitaxial layer 3 by thermal oxidation. Further, a silicon nitride film 5 is deposited on the oxide film 4. Opening 6 is selectively formed by photolithography for a prospective area for the isolation region of the oxide film 4 and the silicon nitride film 5.

(II) Referring to FIG. 1B, the exposed portion of the n-type silicon epitaxial layer 3 is selectively etched to form a groove 7 using the silicon nitride film 5 and the oxide film 4 as masks. In the same manner, boron is ion-implanted using the silicon nitride film 5 and the oxide film 4 as the masks to form a boron-implanted layer 8 in the region of the n-type silicon epitaxial layer 3 in the vicinity of the bottom of the groove 7.

(III) The wafer is oxidized in a wet atmosphere at high temperature using the silicon nitride film 5 as the oxidation-resistive mask. Therefore, the inner surface of the groove 7 is selectively oxidized to form an oxide film isolation layer 9, as shown in FIG. 1C. Simultaneously, boron in the boron-implanted layer 8 is diffused to form a p+-type channel stopper 10. After the silicon nitride film 5 and the oxide film 4 are removed, a p-type base region is formed in the n-type silicon epitaxial layer 3 as an island shape isolated by the oxide film isolation layer 9 in accordance with the conventional process. Further, an n+-type emitter region is formed in the p-type base region. An n+-type collector electrode region is formed on the n-type silicon epitaxial layer 3, thus completing an npn bipolar integrated circuit.

In the selective oxidation method as described above, thermal oxidation must be performed at a high temperature for a long period of time. Therefore, oxidation progresses in the transverse direction through the oxide film 4 under the silicon nitride film 5. In other words, side oxidation occurs and a bird's beak 11 and a bird's head 12 are formed. The oxide film 4 is formed so as not to produce oxynitride from the silicon nitride film 5. The formation of the bird's beak 11 narrows the element formation region and results in a large dimensional change of the element formation region. Further, the pattern precision of openings is degraded and small openings are difficult to form. The formation of the bird's head 12 results in a level difference between the bird's head 12 and the n-type epitaxial layer 3, thus resulting in disconnection of an interconnection electrode layer formed above the bird's head 12 and the n-type epitaxial layer 3.

Further, the wall surface of the groove 7 is oxidized in the lateral direction in the same manner as in the direction of depth of the groove 7. The width of the oxide isolation layer 9 is made to be equal to the sum of the width of the opening of the groove 7 and twice the thickness of the isolation layer 9. In addition to the decrease of the integration density which is caused by the bird's beak as described above, the integration density is thus further lowered.

In the selective oxidation method, the element characteristics are adversely affected. When thermal oxidation is performed in an oxygen atmosphere of high temperature, using the silicon nitride film 5 as the mask, stress acts between the silicon nitride film 5 and the n-type silicon epitaxial layer 3. Further, thermal strain occurring on the n-type silicon epitaxial layer 3 produces crystal defects such as OSF (oxidation induced stacking faults) and the like in the n-type silicon epitaxial layer 3 around the oxide film isolation layer 9, thus degrading the element characteristics.

In order to solve these problems, a method is proposed in IBM Technical Disclosure Bulletin Vol. 22, No. 7, pp. 2749–2750 (December, 1979). This method will be described with reference to FIGS. 2A to 2D.

The n+-type buried layer 2 is formed on the p-type silicon substrate 1. Thereafter, the n-type epitaxial layer 3 is grown on the n+-type buried layer 2. The (underlying) oxide film 4 is formed on the surface of the n-type epitaxial layer 3 to a thickness of about 100 Å. The (first) silicon nitride film 5 of a thickness of about 1,000 Å is deposited on the underlying oxide film 4. A desired opening is formed in the first silicon nitride film 5 and the underlying oxide film 4. Thereafter, the exposed part of the n-type epitaxial layer is etched to form the groove 7, using the first silicon nitride film 5 as the mask. At this time, the first silicon nitride film 5 and the oxide film 4 extend in the form of an over-hang (FIG. 2A). Thermal oxidation is performed to form an oxide film 13 of a thickness of about 100 Å on the inner surface of the groove 7. A second silicon nitride film 14 is formed to cover the entire surface including the groove 7. Reactive ion etching is performed, using the over-hang of the first silicon nitride film 5 as the mask, in order to remove the second silicon nitride film 14 at the bottom of the groove 7 in a self-aligned manner (FIG. 2B). In this manner, the self-aligned silicon nitride film is formed on the side wall of the groove 7. Thereafter, a p+-type impurity is ion-implanted in the bottom of the groove 7 as needed. Therefore, within the groove 7, an oxide isolation layer 9' and a p$^{30}$-type channel stopper 10 are formed (FIG. 2C). The first silicon nitride film 5, the second silicon nitride film 14 and the underlying oxide film 4 are then etched (FIG. 2D).

In the above method, since the self-aligned silicon nitride film which is the oxidation-resistive film is formed on the side wall of the groove 7 by reactive ion etching, side oxidation in the groove 7 is minimized. In particular, an oxidizing agent forms a thick oxide film in the bottom of the groove 7. Further, the oxidizing agent permeates from the bottom of the groove 7 along the oxide film 13 of the side wall of the groove 7. The thus formed oxide film pushes up the second silicon nitride film 14. In this manner, the oxide isolation layer 9' is formed to cover the groove 7. The level of the oxide isolation layer 9' is the same as that of the surface of the n-type silicon epitaxial layer 3. The produced bird's beak is small. However, even if the above method is adopted in order to minimize further the elements, the groove 7 must be filled with the oxide in order to equalize the level of the oxide isolation layer and the n-type silicon epitaxial layer. Therefore, a bird's beak is more or less produced on the oxide isolation layer. It is known that the bird's beak may be minimized by making the first silicon nitride film as the oxidation-resistive mask material thick or by making the underlying oxide film under the first silicon nitride film thin. However, when the first silicon nitride film is made thick and the underlying oxide film is made thin, a crystal defect caused by thermal strain tends to occur in the n-type silicon epitaxial layer. Therefore, this method cannot completely eliminate the bird's beak.

In order to minimize the enlargement of the oxide isolation layer 9' which is caused by the bird's beak and to prevent the formation of the crystal defect in the n-type silicon epitaxial layer 3 around the oxide isolation layer 9', a very thin second silicon nitride film 14 must be formed.

In the method as shown in FIGS. 2A to 2D, since reactive ion etching is performed, using the overhang of the first silicon nitride film 5 as the mask, a very thin silicon nitride film 14 can be properly formed on the side wall of the groove 7. However, the formation of the overhang of the first silicon nitride film 5 is performed by undercutting when the groove 7 is formed by etching. Therefore, the groove 7 is enlarged in the transverse direction to the extent corresponding to the length of the overhang. The enlargement of the groove 7 results directly in the enlargement of the oxide isolation layer 9', degrading the compactness of the elements.

SUMMARY OF THE INVENTION

It is an object of the present invention to provide a method for manufacturing a semiconductor device in which a small isolation region with a flat surface may be precisely formed in accordance with design specifications.

It is another object of the present invention to provide a method for manufacturing a semiconductor device in which an isolation region is formed without performing thermal oxidation at high temperature and for a long period of time.

It is still another object of the present invention to provide a method for manufacturing a semiconductor device in which an isolation region is formed without a bird's beak and without crystal defects in the semiconductor substrate when thermal oxidation is performed.

In order to achieve the above and other objects of the present invention, there is provided a method for manufacturing a semiconductor device comprising the steps of: forming at least one groove in a semiconductor substrate; forming a non-single-crystalline semiconductor film to cover the entire surface of said semiconductor substrate including an inner surface of said groove; selectively etching said non-single-crystalline semiconductor film so as to leave said non-single-crystalline semiconductor film on at least a side wall of said groove; and forming an oxide isolation layer in said groove by thermal oxidation.

According to the method for manufacturing the semiconductor device of the present invention, the level of the small isolation layer is substantially the same as that of the surface of the semiconductor substrate on the basis of design specifications. Transistors and the like may be formed on a prospective element formation island region surrounded by the isolation layer. A semiconductor device with high reliability, high performance, and high integration may be manufactured with high yield.

DETAILED DESCRIPTION OF THE PREFERRED EMBODIMENTS

Figure 1A:
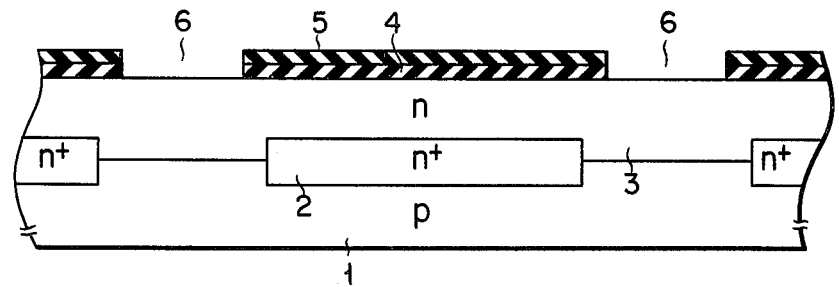
FIGS. 1A to 1C are sectional views for explaining the steps of forming a conventional isolation layer in the manufacture of a bipolar integrated circuit.

The present invention will be described in detail. According to a method of the present invention, at least one groove is formed in a semiconductor substrate. The semiconductor substrate comprises, for example, an n-type or p-type semiconductor substrate, or such a semiconductor substrate or sapphire substrate on which a single-crystalline semiconductor layer is formed. The semiconductor substrate is etched, using an insulating film which has a predetermined pattern as a mask, for example, to form the groove in the semiconductor substrate. The insulating film may be selected from films such as a thermal oxide film, a CVD-SiO$_2$ film, a silicon nitride film, a two-layer structure film consisting of a thermal oxide film and a silicon nitride film. The etching technique may be selected from wet etching or dry etching, and from isotropic etching or anisotropic etching.

After the groove is formed, a non-single-crystalline semiconductor film is formed to cover the entire surface of the semiconductor substrate including the inside surface of the groove by the CVD method, for example. The non-single-crystalline semiconductor film may be selected from a polycrystalline silicon film, a polycrystalline silicon film which contains phosphorus, arsenic, boron or the like as an impurity, an amorphous silicon film, and a metal silicide film such as a molybdenum silicide film, a tantalum silicide film, and a tungsten silicide film. The non-single-crystalline semiconductor film may be converted to an oxide by thermal oxidation to be performed later, so that the oxide isolation layer or part thereof is formed. Further, the non-single-crystalline semiconductor film has an oxidation rate higher than the oxidation rate of the single crystalline semiconductor (semiconductor substrate). Therefore, these non-single-crystalline semiconductor films are easily converted to oxides.

Oxidation may be performed or the oxide film may be formed on the inner surface of the groove prior to the formation of the non-single-crystalline semiconductor film. Further, the oxidation-resistive insulating film may be formed to cover the semiconductor substrate including the inner surface of the groove prior to the formation of the non-single-crystalline semiconductor film. When the oxidation-resistive film is formed, the semiconductor substrate may not be oxidized in the following oxidation step. As a result, the width of the oxide isolation layer may not be larger than the predetermined width. The oxidation-resistive insulating film may include a silicon nitride film, alumina film or the like.

The non-single-crystalline semiconductor film is selectively etched so as to leave the non-single-crystalline semiconductor film at least on the side wall of the groove. This selective etching of the non-single-crystalline semiconductor film may be achieved by performing anisotropic etching such as reactive ion etching on the non-single-crystalline semiconductor film. In this manner, the thickness (vertical direction) of the non-single-crystalline semiconductor film left on the inner wall of the groove is sufficiently greater than the thickness of the non-single-crystalline semiconductor film deposited on the flat semiconductor substrate. Further, with anisotropic etching, the film is etched only in the vertical direction.

When the groove is formed by using the insulating film pattern as the mask as described above, the overhang of the insulating film pattern is formed by isotropic etching, thus leaving a thicker non-single-crystalline semiconductor film on the side wall of the groove.

When the non-single-crystalline semiconductor film remaining on the side wall of the groove is to contain an impurity, a non-single-crystalline semiconductor film which is doped with an impurity is deposited. Alternatively, after the non-single-crystalline semiconductor film which is not doped with the impurity is left on the side wall of the groove, an impurity is doped.

Finally, thermal oxidation is performed to convert the non-single-crystalline semiconductor film remaining on the side wall of the groove to an oxide, thus forming an oxide isolation layer. In this case, all of the non-single-crystalline semiconductor film remaining on the side wall of the groove may be oxidized to fill the groove entirely. Alternatively, part of the non-single-crystalline semiconductor film remaining on the side wall of the groove may be oxidized to narrow the opening of the groove.

Further, when an isolation layer of wide width is to be formed, a groove of wide width is formed and an insulating film whose thickness is substantially the same as the depth of the groove is formed at the center of the groove. Two grooves of narrow width are thus formed. In the same manner as described above, oxide films are formed in the two grooves. Therefore, an isolation area of wide width comprising the two oxide films and the insulating film therebetween may be formed.

When the oxidation-resistive film is formed to cover the semiconductor substrate, including the inner surface of the groove, etching is performed using the non-single-crystalline semiconductor film remaining only on the side wall of the groove as the mask (remaining pattern), thus properly forming the thin oxidation-resistive film only on the side wall of the groove. In this condition, oxidation is performed, and an oxidizing agent permeates to the bottom of the groove where the oxidation-resistive film is not present. Therefore, the oxide film is formed, and simultaneously, the oxidizing agent further permeates along the inner surface of the oxidation-resistive film, thus forming the oxide film. As a result, the oxidation-resistive film is pushed upward, so that the groove is filled with the oxide film. In this manner, the oxide isolation layer is formed. In this case, the non-single-crystalline semiconductor film is oxidized to be part of the oxide isolation layer. Alternatively, the non-single-crystalline semiconductor film may be removed before oxidation. When the non-single-crystalline semiconductor film is to be etched before oxidation, this film functions only as the mask (remaining pattern) for properly forming the oxidation-resistive film only on the side wall of the groove. In this latter case, the non-signal-crystalline semiconductor film may be substituted by an impurity doped or undoped CVD-SiO$_2$ film to effectively perform patterning of the oxidation-resistive film.

The present invention may be applied to a method for manufacturing various semiconductor devices such as an n-channel MOS type integrated circuit, a p-channel MOS type integrated circuit, an npn bipolar type integrated citcuit, an I$^2$L (integrated injection logic), an ECL (emitter coupled logic), an SITL (static induction transistor logic) and so on.

Various examples according to the present invention will be described in detail with reference to the accompanying drawings.

EXAMPLE 1

This example is the case in which the present invention is applied to the manufacture of a MOS type integrated circuit.

Figure 3A:
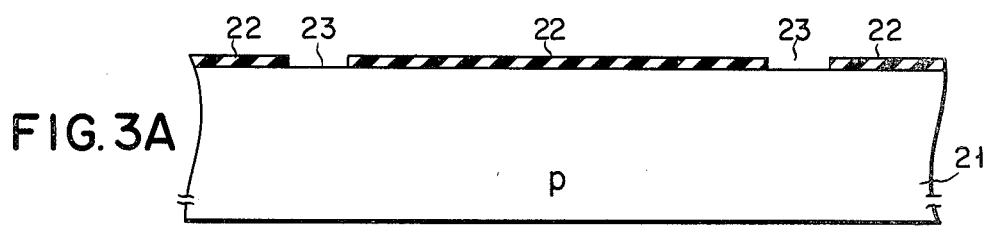
FIGS. 3A to 3I are sectional views for explaining the sequential steps of manufacturing a semiconductor device according to one example of the present invention when the present invention is applied to the manufacture of a MOS type integrated circuit.
Figure 3B:
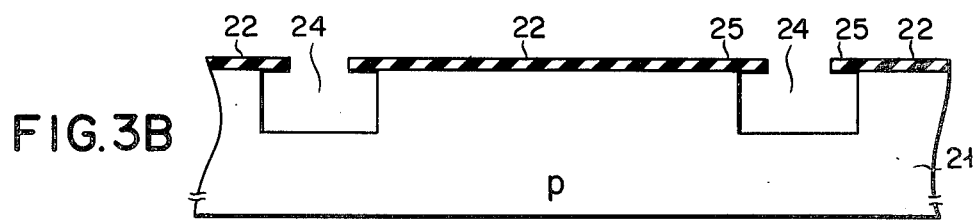
Figure 3C:
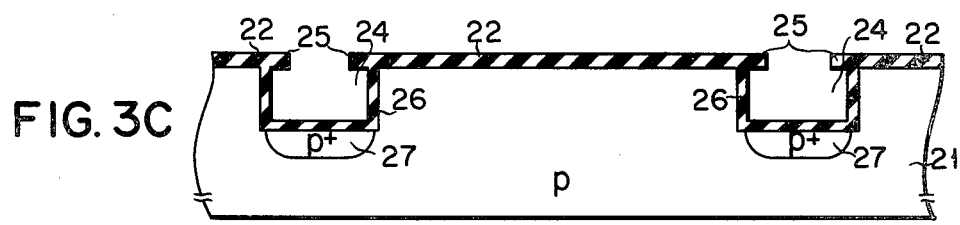

An oxide film 22 of a thickness of 1,000 Å was formed on one major surface of a p-type silicon substrate 21. Part of a prospective formation area of an isolation layer for elements of the oxide film 22 was selectively etched by photolithography to form an opening 23 (FIG. 3A). Thereafter, isotropic etching according to dry etching using a Freon type etchant was performed on an exposed part of the silicon substrate 21, using the oxide film 22 as a mask. A groove 24 of a width of about 1.0 μm and a depth of about 1.0 μm was formed. An over-hang portion 25 of the oxide film was formed at the opening of the groove 24 (FIG. 3B). Then, boron was ion-implanted in the bottom of the groove 24, using the oxide film 22 as the mask. Thermal oxidation was then performed. Then, an underlying oxide film 26 of a thickness of 1,000 Å was formed on the inner surface of the groove 24, and simultaneously boron which was ion-implanted was diffused so as to form a $p^+$-type channel stopper 27 at the bottom of the groove 24 (FIG. 3C).

Figure 3D:
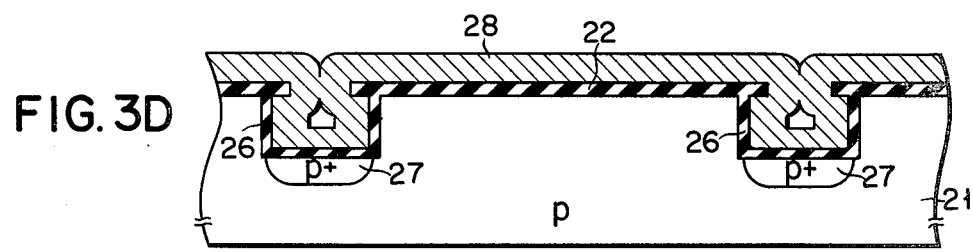
Figure 3E:
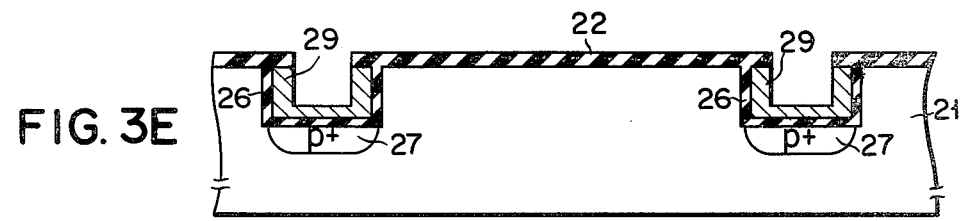
Figure 3F:
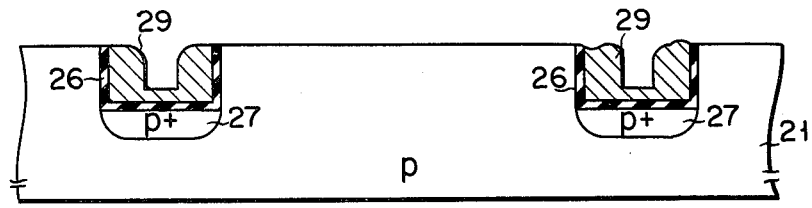

An arsenic-doped polycrystalline silicon film 28 was deposited by the reduced-pressure CVD method on the entire surface of the silicon substrate 21 to a thickness of 1 to 1.5 μm so as to fill the groove 24. The film deposited by the reduced-pressure CVD method resulted in good step coverage of the uneven portion, so that the polycrystalline silicon film 28 was deposited entirely on the inner surface of the groove 24, as shown in FIG. 3D. Therefore, the groove 24 was filled completely with the polycrystalline silicon film 28. The arsenic-doped polycrystalline silicon film 28 was then etched by reactive ion etching. At this time, reactive ion etching progresses only in the vertical direction on the silicon substrate 21, so that a polycrystalline film 29 remained on the side surface of the groove which was directly below the over-hang 25 of the oxide film 22 and remained at the bottom thereof, as shown in FIG. 3E.

Figure 3G:
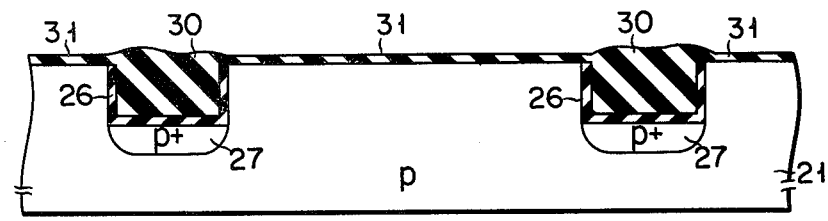

The oxide film 22 on the silicon substrate 21 was then etched by an etchant of the hydrofluoric acid type. At this time, the oxide film 22 was etched in the self-aligned manner. The wafer was then thermally oxidized in a low-temperature wet atmosphere at a temperature range of 700° to 900° C. At this time, since the arsenic-doped polycrystalline silicon film 29 remaining in the groove 24 had an oxidation rate higher than that of the exposed single-crystalline p-type silicon substrate 21, the polycrystalline silicon film 29 remaining in the groove 24 was oxidized as shown in FIG. 3G, so that the polycrystalline silicon film 29 was converted to a silicon oxide 30 whose thickness was twice the thickness of the polycrystalline silicon film 29. Therefore, the groove 24 was filled with the silicon oxide 30. Simultaneously, a thin thermal oxide film 31 was formed to a thickness of 500 to 1,000 Å on the exposed silicon substrate 21.

Figure 3H:
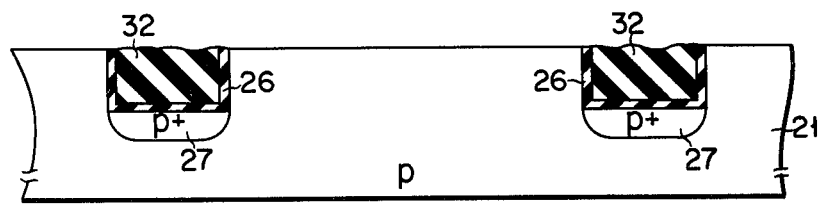
Figure 3I:
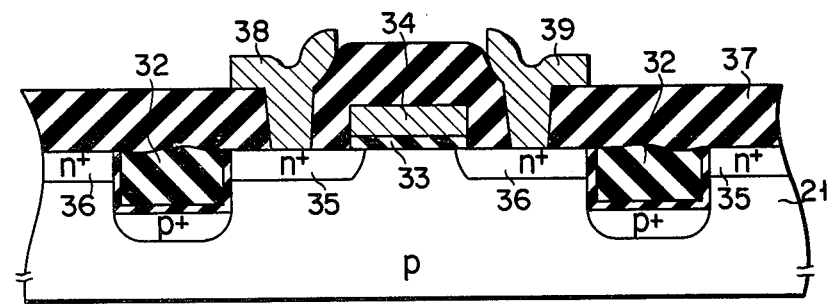

The thermal oxide film 31 on the silicon substrate 21 was etched by an etchant of the hydrofluoric acid type for a short period of time. The level of the silicon oxide 30 was substantially the same as that of the surface of the silicon substrate 21. Therefore, an isolation layer 32 was formed (FIG. 3H). A gate oxide 33 and a gate electrode 34 was formed in the substrate island region isolated by the isolation layer 32 in accordance with the conventional process. Phosphorus was ion-implanted in the substrate island region, using the gate electrode 34 and the isolation layer 32 as the masks. After phosphorus was diffused to form $n^+$-type source and drain regions 35 and 36, a CVD-SiO$_2$ film 37 was deposited to cover the entire surface. An opening was then formed in the CVD-SiO$_2$ film 37. Further, aluminum electrodes 38 and 39 for the source and drain were deposited by vapor deposition and patterning of the aluminum film. Thus, an n-channel MOS type integrated circuit was manufactured (FIG. 3I).

According to Example 1, the arsenic-doped polycrystalline silicon film 28 was deposited in the groove 24 formed on the silicon substrate 21 so as to bury the groove 24. Then, reactive ion etching which progresses only in the vertical direction was performed. Thereafter, the polycrystalline silicon film 29 remained on the inner surface of the groove 24 which was directly below the over-hang 25 of the silicon oxide film 22 and at the bottom thereof. The arsenic-doped polycrystalline silicon film 29 was then thermally oxidized. The silicon oxide 30 converted from the remaining polycrystalline silicon film 29 filled the groove 24 completely, thus accomplishing the excellent isolation layer 32. Therefore, according to this method, various effects are obtained as follows.

(1) The remaining polycrystalline silicon film 29 which has an oxidation rate greater than that of the single-crystalline silicon substrate is easily thermally oxidized. Therefore, thermal treatment at a high temperature for a long period of time is not required as in the conventional selective oxidation isolation technique. The polycrystalline silicon film 29 remaining in the groove 24 is thus easily filled with the silicon oxide 30. For this reason, the redistribution of the diffusion layer prior to the formation of the isolation layer 32 is well controlled and crystal defects of the silicon substrate 21 are mostly prevented. As a result, a MOS type integrated circuit, whose element characteristics such as the threshold voltage (Vth) are excellent, is accomplished. Especially, as described in Example 1, when the non-single-crystalline semiconductor film is the arsenic-doped polycrystalline silicon film 28, the polycrystalline silicon film 29 remaining in the groove 24 is easily converted to the silicon oxide at a low temperature range of 700° to 900° C. as compared to a case wherein an undoped polycrystalline silicon film is used. Therefore, crystal defects of the silicon substrate 21 are further prevented.

(2) The polycrystalline silicon film 29 remaining in the groove 24 has an oxidation rate higher than that of the silicon substrate 21. In the case of thermal oxidation, only the polycrystalline silicon film 29 remaining in the groove 24 is converted to the silicon oxide, while a very thin thermal oxide film is formed on the upper surface of the silicon substrate and the inner surface of the groove 24. Therefore, even if the depth of the isolation layer 32 becomes greater, side oxidation which occurs in conventional selective oxidation does not occur, and the width of the isolation layer 32 is substantially kept constant. As a result, the isolation performance between the elements is excellent, and the formation of the isolation layer of small width may be formed. Further, an MOS type integrated circuit of high integration density may be accomplished. Especially, as in Example 1 described above, since the arsenic-doped polycrystalline silicon film 28 is used as the non-single-polycrystalline semiconductor film, the oxidation rate is increased as compared with the oxidation rate of the silicon substrate 21, thus forming the isolation layer of constant width.

According to Example 1, using the over-hang of the oxide film 22 extending to the opening of the groove 24, when the arsenic-doped polycrystalline silicon film 28 is etched by anisotropic etching such as reactive ion etching, the polycrystalline silicon film 29 remaining on the side surface of the groove 24 is properly formed. Further, the polycrystalline silicon film 29 of an arbitrary thickness which remains on the side surface of the groove 24 may be formed in accordance with the length of the over-hang 25. Therefore, the width of the isolation layer 32 is determined by the length of the over-hang 25 of the oxide film 22. The problem of enlarging the width of the isolation layer in conventional selective oxidation can be controlled thus increasing the integration density and minimizing the dimensional change.

EXAMPLE 2

This example is a case in which the present invention is applied to the manufacture of an npn bipolar type integrated circuit.

Figure 4A:
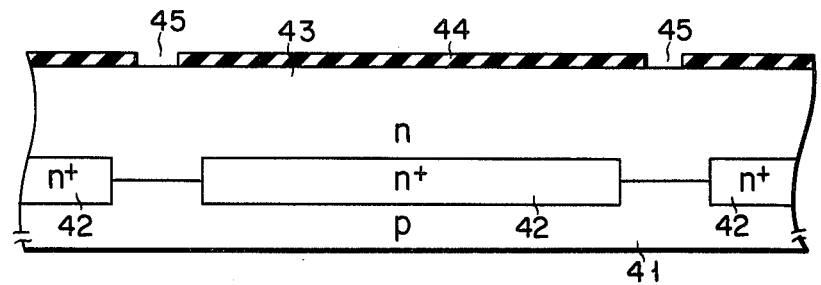
FIGS. 4A to 4H are sectional views for explaining the steps of forming an isolation layer according to another example of the present invention when the present invention is applied to the manufacture of a bipolar type integrated circuit.

An n+-type buried layer 42 was selectively formed on one major surface of a p-type silicon substrate 41. Thereafter, an n-type silicon epitaxial layer 43 of about 3.5 μm thick was deposited by the epitaxial growth method. The n-type silicon epitaxial layer 43 was then thermally oxidized to form an oxide film 44 to a thickness of about 2,000 Å. Part of a prospective formation area of an isolation region of the oxide film 44 was selectively etched by photolithography to form an opening 45 (FIG. 4A).

Figure 4B:
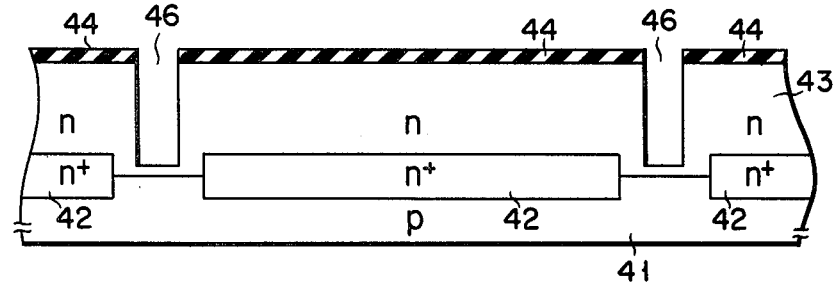
Figure 4C:
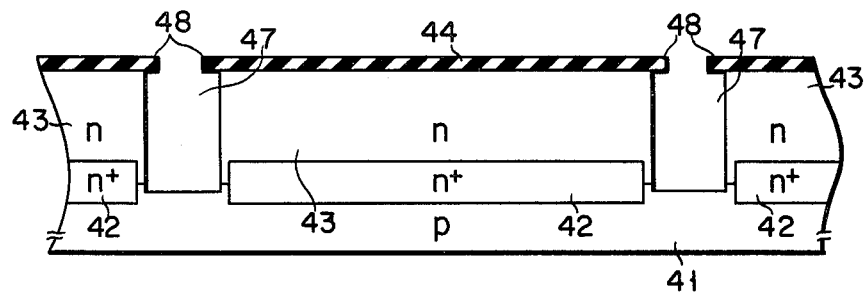
Figure 4D:
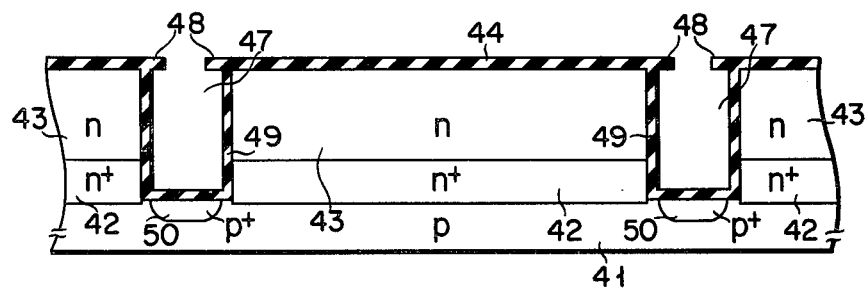

The exposed n-type silicon epitaxial layer 43 was selectively etched by reactive ion etching, using the oxide film 44 as a mask. A groove 46 of about 1.5 μm in width and about 3 μm in depth was then formed. The groove 46 almost reached the surface of the silicon substrate 41 (FIG. 4B). Subsequently, isotropic etching according to wet or dry etching using an etchant of the Freon type was performed to etch the n-type silicon epitaxial layer 43 formed on the inner surface of the opening 46 in the direction of depth and width. Therefore, a groove 47 was formed. Simultaneously, an over-hang 48 of the oxide film 44 was formed at the opening of the groove 47 (FIG. 4C). After thermal oxidation was performed and an underlying oxide film 49 was formed on the inner surface of the groove 47 to a thickness of about 1,000 Å, boron was then ion-implanted in the p-type silicon substrate 41 through the underlying oxide film 49, using the oxide film 44 as a mask. Further, annealing was performed to diffuse boron to form a p+-type channel stopper 50 (FIG. 4D). In this process, alternatively, after the groove 47 is formed, boron may be ion-implanted in the p-type silicon substrate 41 at the bottom of the groove, using the oxide film 44 as the mask. Subsequently, annealing may be performed so that the underlying film of about 1,000 Å thick may be formed on the inner surface of the groove 47 and boron may be diffused to form the p+-type channel stopper 50.

Figure 4E:
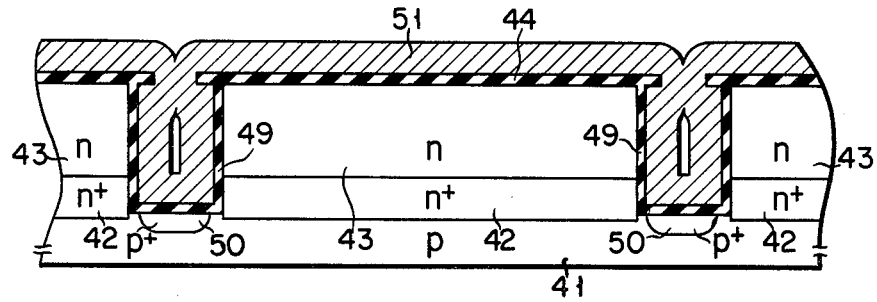
Figure 4F:
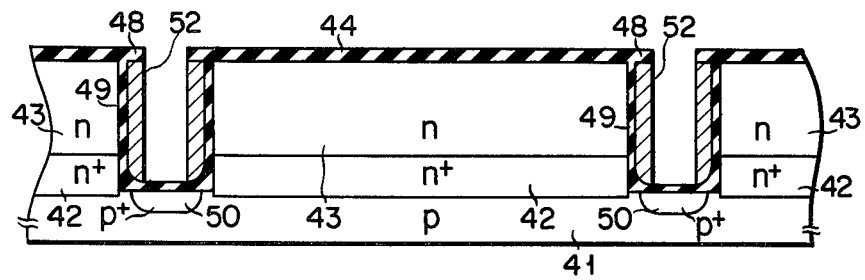

An arsenic-doped polycrystalline film 51 was deposited by the reduced-pressure CVD method to bury the groove 47 and to cover the entire surface to a thickness of about 1 to 1.5 μm. At this time, as shown in FIG. 4E, the reduced-pressure CVD method provided excellent step coverage of the uneven portion, so that the polycrystalline silicon film 51 was entirely deposited even at the corners of the underlying oxide film 49 of the groove 47. Thereafter, the arsenic-doped polycrystalline silicon film 51 was etched by reactive ion etching. Reactive ion etching progresses only in the vertical direction of the silicon substrate 41, so that a polycrystalline silicon film 52 remained in the groove 47 under the over-hang 48 of the oxide film 44, as shown in FIG. 4F.

Figure 4G:
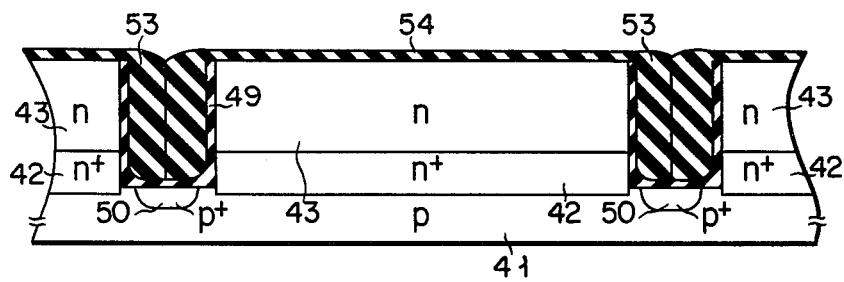

The oxide film 44 on the n-type silicon epitaxial layer 43 was treated by an etchant of the hydrofluoric acid type. Therefore, the oxide film was etched in the self-aligned manner. The wafer was then thermally oxidized in a low temperature wet atmosphere of 700° to 900° C. At this time, the polycrystalline silicon film 52 remaining in the groove 47 had an oxidation rate higher than that of the exposed n-type single-crystalline silicon epitaxial layer 43, so that the remaining polycrystalline silicon film 52 in the groove 47 was oxidized and converted to a silicon oxide 53 whose thickness was twice the thickness of the previously remaining polycrystalline silicon film 52, as shown in FIG. 4G. The silicon oxide 53 filled the groove 47, while a thin thermal oxide film 54 of 500 to 1,000 Å in thickness was formed on the exposed n-type silicon epitaxial layer 43.

Figure 4H:
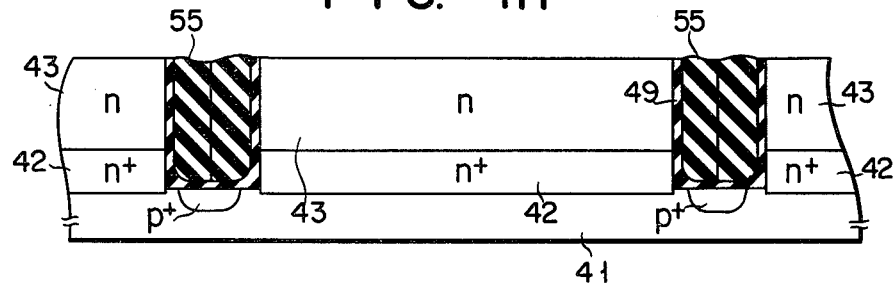

The entire surface was etched by an etchant of the hydrofluoric acid type for a short period of time so that the thin thermal oxide film 54 on the n-type silicon epitaxial layer 43 was etched. Therefore, the underlying oxide film 49 and the silicon oxide 53 filled the groove 47, and simultaneously the surface level of the silicon oxide 53 became substantially the same as the surface level of the n-type silicon epitaxial layer 43. Thus, an isolation layer 55 was formed (FIG. 4H). A p-type base region (not shown) was formed in the n-type silicon epitaxial layer (collector region) isolated by the isolation layer 55 in accordance with the conventional method. Further, an n+-type emitter region was formed in the base region of the n-type epitaxial layer. Finally, an n+-type collector electrode region or the like was formed in the n-type silicon epitaxial layer, thus accomplishing an npn bipolar type integrated circuit.

In summary, according to Example 2, occurrence of the crystal defects are prevented in the step of forming the isolation layer. Further, the small isolation layer 55, thus accomplished, has a flat surface, resulting in excellent element characteristics such as current amplification and the like. The high integration density of the bipolar type integrated circuit is achieved.

Examples 3 and 4 to be described below are cases wherein the present invention is applied to the manufacture of an npn bipolar type integrated circuit. An oxidation-resistive insulating film is used to prevent oxidation of the semiconductor substrate at the time of thermal oxidation.

EXAMPLE 3

Figure 5A:
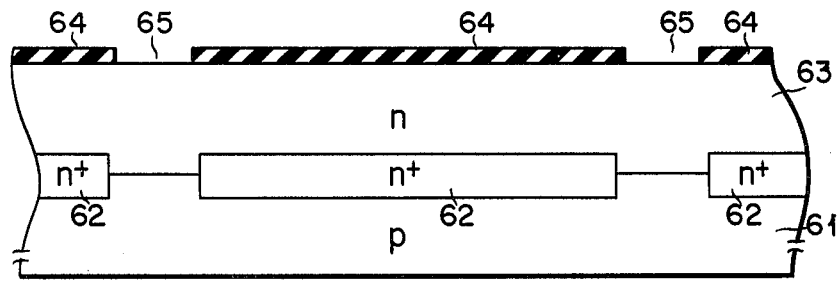
FIGS. 5A to 5G are sectional views for explaining the steps of forming an isolation layer according to still another example of the present invention when the present invention is applied to the manufacture of a bipolar type integrated circuit.

An n+-type buried layer 62 was selectively formed on one major surface of a p-type silicon substrate 61. Thereafter, an n-type silicon epitaxial layer 63 was formed thereon to a thickness of about 3.5 μm by the epitaxial growth method. The n-type silicon epitaxial layer 63 was thermally oxidized to form an oxide film 64 to a thickness of about 2,000 Å. A prospective element formation area of an isolation region of the oxide film 64 was selectively etched to form an opening 65 (FIG. 5A).

Figure 5B:
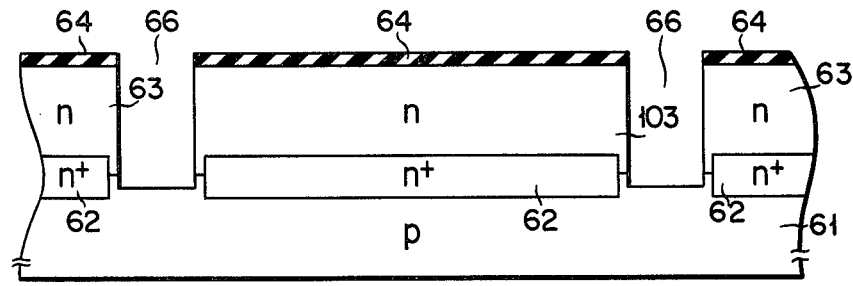
Figure 5C:
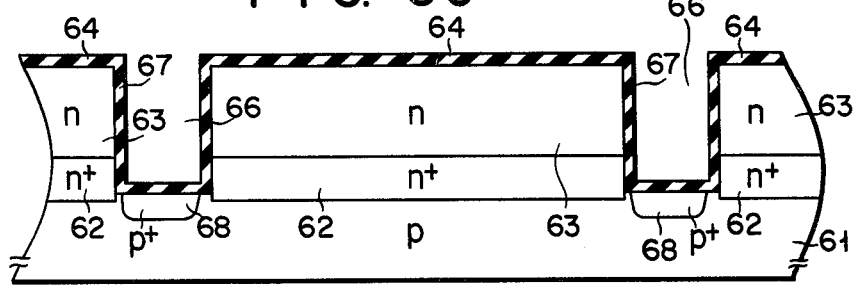

The n-type silicon epitaxial layer 63 which was exposed was selectively etched, using the oxide film 64 as a mask, to form a groove 66 of about 2.0 μm in width and about 4 μm in depth. The groove 66 reached the silicon substrate 61 (FIG. 5B). Thermal oxidation was then performed to form an underlying oxide film 67 to a thickness of about 100 Å on the inner surface of the groove 66. Boron was then ion-implanted in the p-type silion substrate 61 through the underlying oxide film 67, using the oxide film 64 as a mask. Further, annealing was performed to diffuse boron and to form a p+-type channel stopper 68 (FIG. 5C).

Figure 5D:
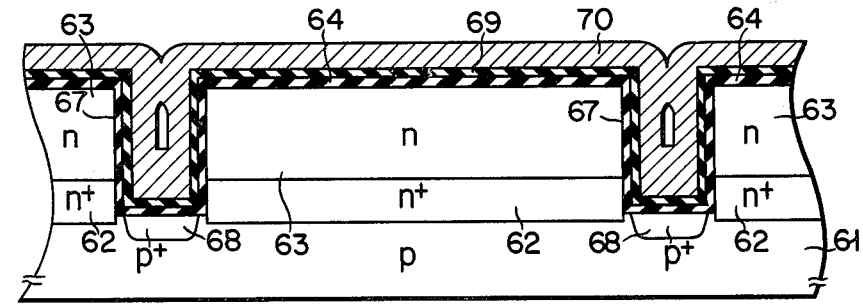
Figure 5E:
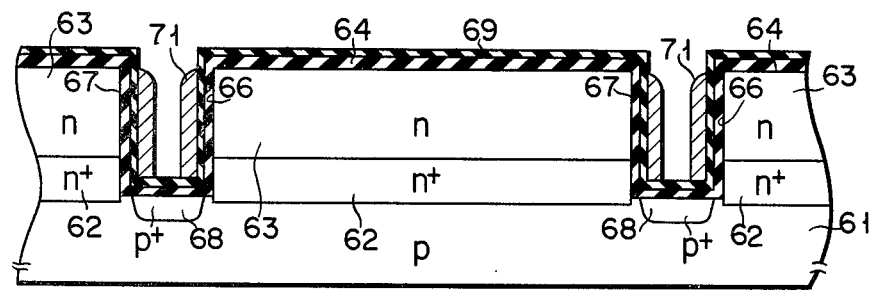
Figure 5F:
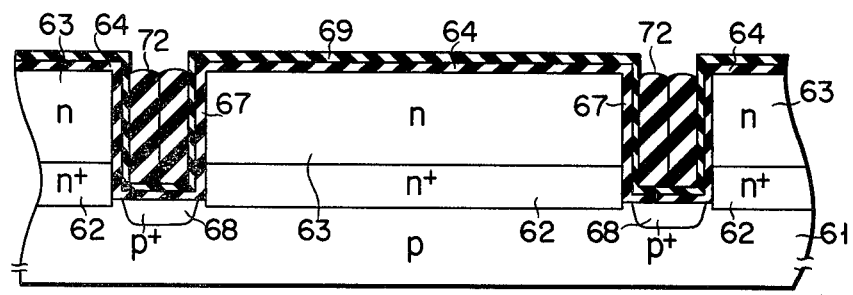

A silicon nitride film 69 (oxidation-resistive insulating film) of 500 Å thick was deposited on the entire surface by the reduced-pressure CVD method. An arsenic-doped polycrystalline film 70 was deposited to a thickness of 800 to 1,000 Å by the reduced-pressure CVD method so as to bury the groove 66. The reduced-pressure CVD method provides excellent step coverage of the uneven portion, so that the arsenic-doped polycrystalline silicon film 70 was completely deposited even at the corners of the silicon nitride film 69 in the groove 66, as shown in FIG. 5D. Reactive ion etching was then performed to etch the polycrystalline silicon film 70 to a depth slightly greater than the thickness of the polycrystalline silicon film on the silicon nitride film 69 except for the area above the groove. At this time, the thickness of the polycrystalline silicon film 70 deposited in the groove 66 in the vertical direction was greater than that of the polycrystalline silicon film 70 on the silicon nitride film 69 except for the area above the groove. Further, reactive ion etching progresses only in the vertical direction of the silicon substrate 61. Therefore, as shown in FIG. 5E, a polycrystalline silicon film 71 remained on the side surfaces of the underlying oxide film 67 of the groove 66. Thermal oxidation was then performed in a wet atmosphere at a temperature of 650° to 900 ° C. At this time, the polycrystalline silicon film 71 remaining in the groove 66 was oxidized. The groove 66 was then buried by the silicon oxide whose thickness was twice the thickness of the polycrystalline silicon film 71. Therefore, the surface level was substantially the same as that of the n-type silicon epitaxial layer 63 of an island shape, thus accomplishing an isolation layer 72 (FIG. 5F).

Figure 5G:
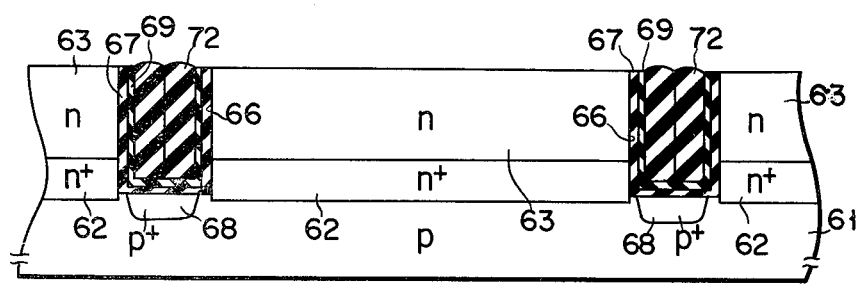

As shown in FIG. 5G, part of the silicon nitride film 69 and the oxide film 64 on the n-type silicon epitaxial layer 63 of an island shape isolated by the isolation layer 72 was etched. In accordance with the conventional method, a p-type base region (not shown) was formed in the n-type silicon epitaxial layer (collector region) of the island. Further, an n+-type emitter region (not shown) was formed in the base region of the n-type silicon epitaxial layer of the island and an n+-type collector electrode region (not shown) was also formed in the epitaxial layer. Thus, an npn bipolar type integrated circuit was accomplished.

According to Example 3 as described above, the underlying oxide film 67 was deposited on the inner surface of the groove 66 formed in the n-type silicon epitaxial layer 63. The silicon nitride film 69 was deposited in the groove 66. Further, the arsenic-doped polycrystalline silicon film 70 was deposited on the silicon nitride film 69 so as to bury the groove 66. Reactive ion etching which progresses only in the vertical direction of the silicon substrate was selectively performed to leave the polycrystalline silicon film 71 only on the surface of the groove 66. The polycrystalline silicon film 71 was thermally oxidized so that the remaining polycrystalline silicon film 71 was converted to the silicon oxide to completely bury the groove 66 and to form the flat isolation layer 72 without forming an oxide film on the surface of the n-type silicon epitaxial layer 63 and the inner surface of the groove 66 under the presence of the silicon nitride film 69. Therefore, the following effects are accomplished by the above-mentioned method.

(1) The remaining polycrystalline silicon film 71 which has an oxidation rate higher than the single-crystalline silicon film is thermally oxidized. Further, the remaining polycrystalline silicon film 71 to be oxidized is present on the side surface of the groove 66, thus resulting in a wide oxidation surface. Thermal oxidation at high temperature for a long period of time required in the conventional selective oxidation isolation technique is not required in the present invention. The groove 66 can be buried by the silicon oxide which is converted from the polycrystalline silicon film 71 remaining in the groove 66. Therefore, the redistribution of the diffusion layer before the isolation layer 72 is formed is well controlled and the occurrence of the crystal defects is prevented, thus accomplishing a bipolar type integrated circuit whose element characteristics such as current amplification ($h_{FE}$) are excellent. Especially, when the arsenic-doped polycrystalline silicon film is used as the non-single-crystalline silicon film, the polycrystalline silicon film remaining in the groove is converted to the silicon oxide at low temperature as compared with an undoped polycrystalline silicon film. Therefore, the occurrence of the crystal defects is further prevented.

(2) The silicon nitride film 69 was formed to cover the n-type silicon epitaxial layer (including the inner surface of the groove 66). The polycrystalline silicon film 71 was left on the side surface of the groove 66. Only the remaining polycrystalline silicon film 71 was converted to the silicon oxide while the oxidation of the inner surface of the groove 66 and the upper surface of the n-type silicon epitaxial layer was prevented owing to the presence of the silicon nitride film 69. Therefore, side etching as in the conventional selective oxidation does not occur, resulting in a uniform width of the isolation layer 72. The isolation performance of the isolation layer 72 is excellent and the isolation layer of small width may be accomplished. As a result, the bipolar type integrated circuit of high integration density is accomplished.

EXAMPLE 4

Figure 6A:
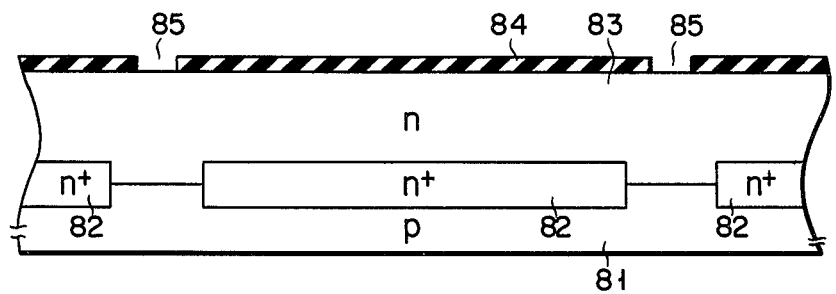
FIGS. 6A to 6H are sectional views for explaining the steps of forming an isolation layer according to still another example of the present invention when the present invention is applied to the manufacture of a bipolar type integrated circuit.

An n+-type buried layer 82 was selectively formed on one major surface of a p-type silicon substrate 81. An n-type silicon epitaxial layer 83 of 3.5 μm thick was then deposited on the n+-type buried layer 82 by the epitaxial growth method. Subsequently, the n-type silicon epitaxial layer 83 was thermally oxidized to form an oxide film 84 to a thickness of about 2,000 Å. Part of a prospective element formation area of an isolation region of the oxide film 84 was selectively etched by photolithography to form an opening 85 (FIG. 6A).

Figure 6B:
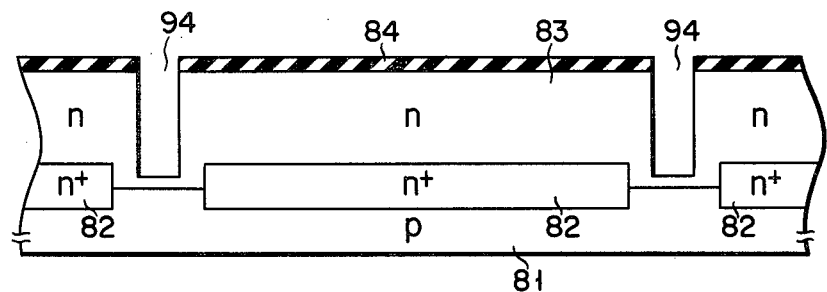
Figure 6C:
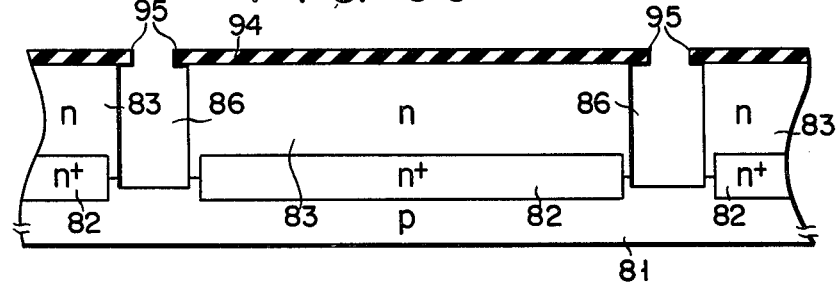
Figure 6D:
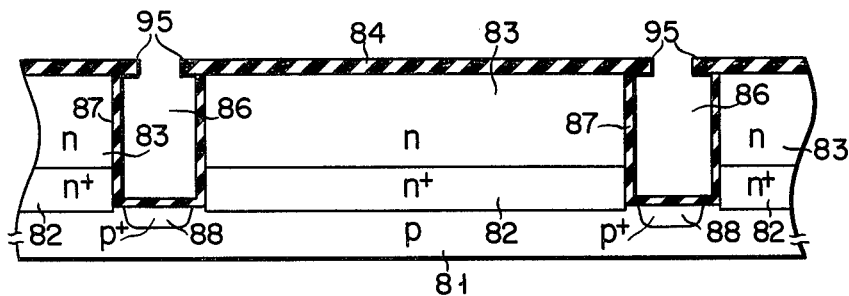

The exposed n-type silicon epitaxial layer 83 was selectively etched by reactive ion etching, using the oxide film 84 as a mask. Therefore, a groove 94 of about 1.5 μm in width and about 3 μm in depth was formed. The groove 94 almost reached the surface of the silicon substrate 81 (FIG. 6B). Isotropic etching using an etchant of the Freon type in accordance with dry or wet etching was performed to further eliminate the n-type silicon epitaxial film 83 exposed in the groove 94 in the direction of width and depth, so that a groove 86 was formed and an over-hang 95 of the oxide film 84 on the groove 86 (FIG. 6C). Subsequently, thermal oxidation was performed to form an underlying oxide film 87 of about 100 Å thick on the inner surface of the groove 86. Boron was then ion-implanted in the bottom of the groove 86 through the underlying oxide film 87, using the oxide film 84 as a mask. Further, annealing was performed to diffuse boron to form a p+-type channel stopper 88 (FIG. 6D).

Figure 6E:
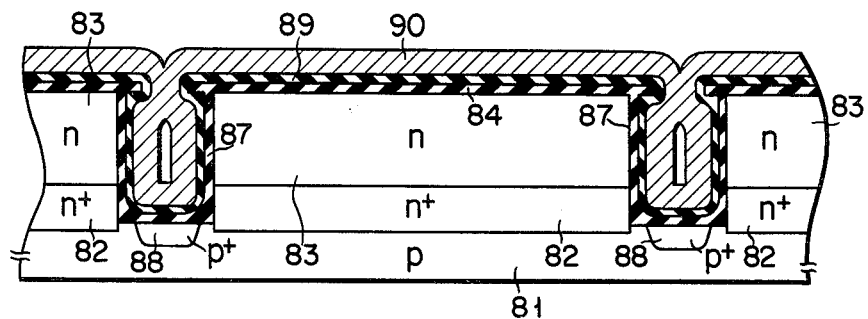
Figure 6F:
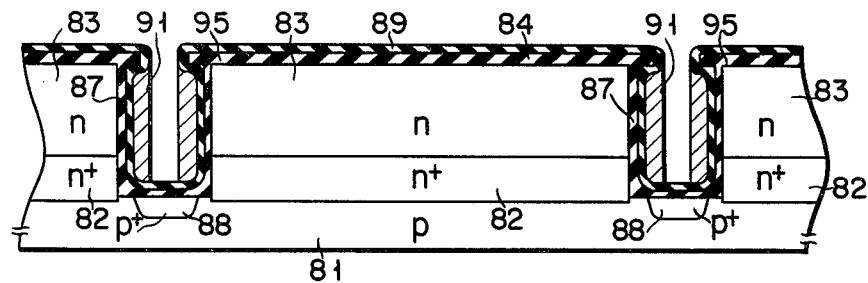

A silicon nitride film 89 (oxidation-resistive insulating film) was formed to a thickness of 500 Å to cover the oxide film 84 by the reduced-pressure CVD method. An arsenic-doped polycrystalline silicon film 90 was then deposited on the silicon nitride film 89 to a thickness of 8,000 to 10,000 Å by the reduced-pressure CVD method so as to fill the groove 86. The reduced-pressure CVD method provides excellent step coverage for the uneven portion, so that, as shown in FIG. 6E, the silicon nitride film 89 of 500 Å thick was completely deposited on the underlying oxide film 87 on the inner surface of the groove 86 and the arsenicdoped polycrystalline silicon film 90 was deposited on the silicon nitride film 89 so as to fill the groove 86. Reactive ion etching was then performed to etch the arsenic-doped polycrystalline silicon film 90. At this time, reactive ion etching progresses only in the vertical direction of the silicon substrate 81. As shown in FIG. 6F, the polycrystalline silicon film 91 therefore remained only on the side surface of the groove 86 under the over-hang 95 of the oxide film 84.

Figure 6G:
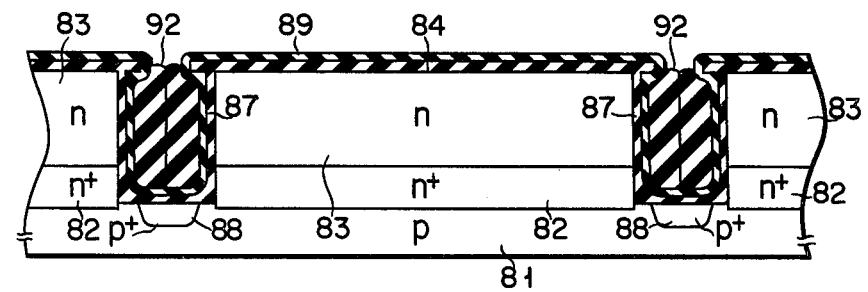
Figure 6H:
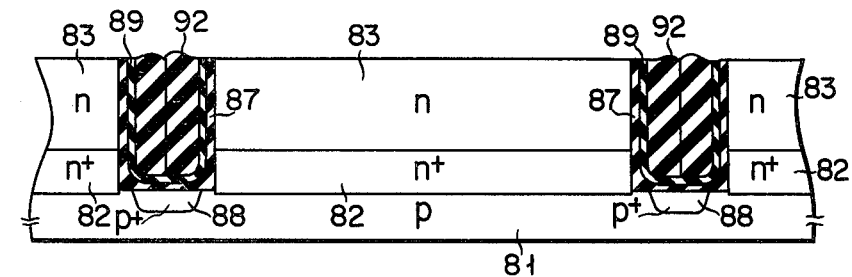

The wafer was then thermally oxidized in a wet oxygen atmosphere of a temperature range of 650° to 900° C. The remaining polycrystalline silicon film 91 in the groove 86 was oxidized and coverted to the silicon oxide. The silicon oxide had a thickness twice the thickness of the polycrystalline silicon film 91 so that the groove 86 was filled with the silicon oxide. The surface level of the silicon oxide was substantially the same as that of the n-type silicon epitaxial layer 83. Thus, an isolation layer 92 was formed (FIG. 6G). As shown in FIG. 6H, parts of the silicon nitride film 89 and the oxide film 84, which were formed on the n-type silicon epitaxial layer 83 of an island isolated by the isolation layer 92 (except for the silicon nitride film 89 and the oxide film 84 which are formed in the groove 86), were etched. Subsequently, although not shown in the figure, in accordance with the conventional method, a p-type base region was formed in the n-type silicon epitaxial layer (collector region) of the island. Further, an n+-type emitter region was formed in the base region of the n-type silicon epitaxial layer. An n+-type collector electrode region was formed in the n-type silicon epitaxial layer. Thus, the npn bipolar type integrated circuit was accomplished.

Figure 1B:
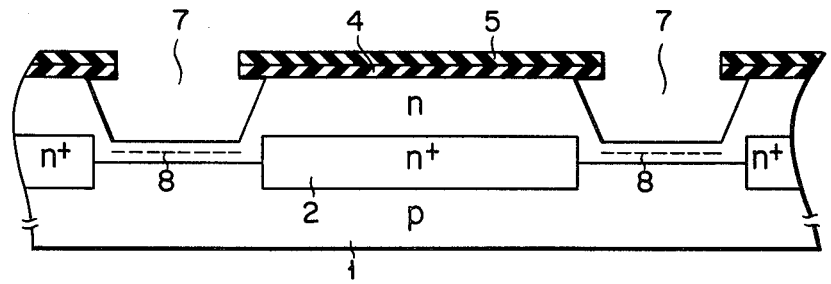
Figure 1C:
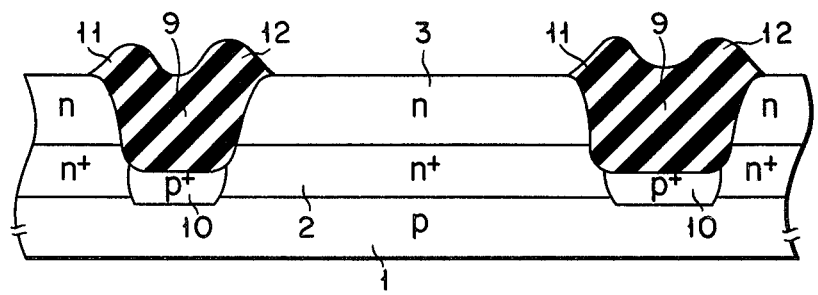
Figure 2A:
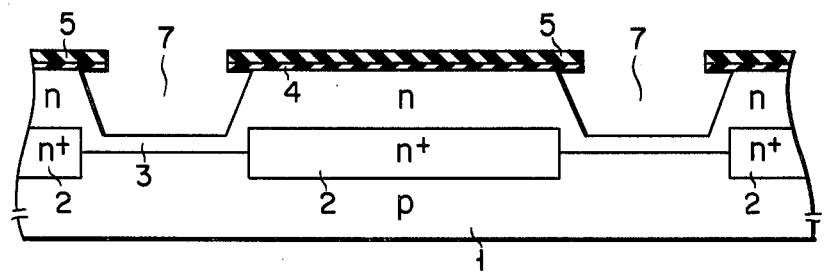
FIGS. 2A to 2D are sectional views for explaining the steps of forming another conventional isolation layer in the manufacture of a bipolar integrated circuit.
Figure 2B:
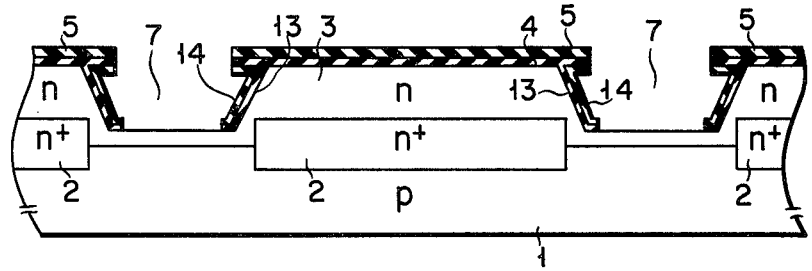
Figure 2C:
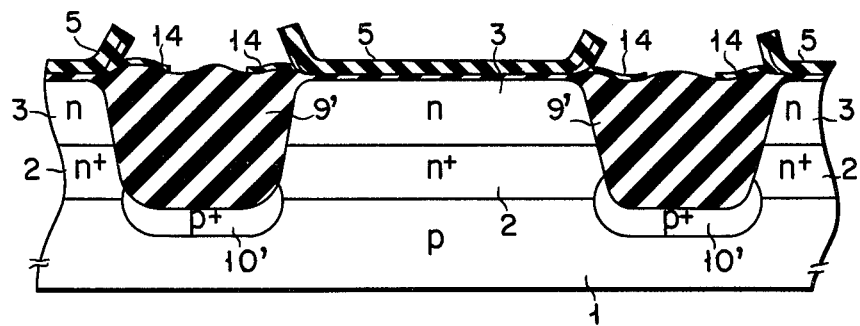
Figure 2D:
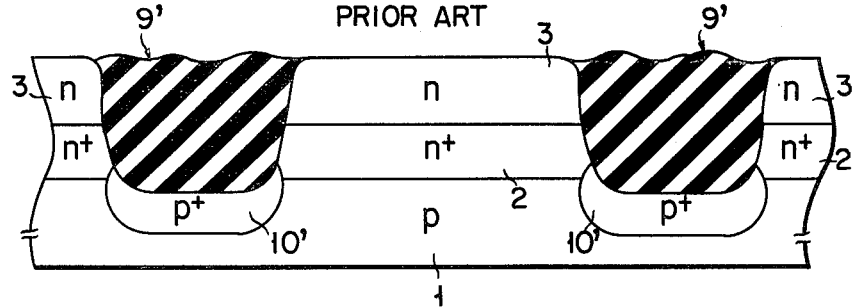

According to Example 4, the element characteristics such as current amplification ($h_{FE}$) are excellent, resulting in the bipolar type integrated circuit of high integration density in the same manner as in Example 3. Further, according to the method as described above, reactive ion etching which progresses only in the vertical direction is performed while the over-hang 95 of the oxide film 84 which extends to the opening of the groove 86 is utilized to leave properly the polycrystalline silicon film 91 on the inner surface of the groove 86. Furthermore, the polycrystalline silicon film 91 of any thickness may be left in accordance with the length of the over-hang 95. For example, when the total length of the over-hang 95 of the oxide film 84 which extends to the opening of the groove 86 is 1.5 μm, the thickness of the remaining polycrystalline silicon film 91 becomes 1.5 μm. The silicon oxide isolation layer 92 of 3 μm in depth and 3 μm in width is filled in the groove 86. In this case, even if the depth of the groove 86 is greater than 3 μm such as 4 μm, 5 μm,..., the width of the silicon oxide (isolation layer) can be made to be constant at 3 μm. Therefore, the width of the isolation layer formed in Example 4 is determined by the width of the over-hang 95 of the oxide film 84. The enlargement of the width of the isolation layer in proportion to the depth of the isolation layer, which occurs in the conventional isolation technique, is prevented. The integration density is increased and the dimensional change is minimized. When the isolation layer is to be formed in accordance with the conventional selective oxidation method as shown in FIGS. 1A to 1C, side etching occurs at both sides of the groove for a distance of 1.5 μm, that is, a total of 3 μm, when a groove of 1.5 μm deep is to be formed. Further, at the time of thermal oxidation, etching progresses by 1.5 μm at each side of the groove. Therefore, the final width of the isolation layer becomes a total of 7.5 μm.

In the above example, all the remaining polycrystalline silicon film is converted to the silicon oxide. However, the polycrystalline silicon film may be partially left and covered by the silicon oxide.

EXAMPLE 5

This example shows a case wherein an oxide isolation layer of narrow width and an oxide isolation layer of wide width are simultaneously formed.

Figure 7A:
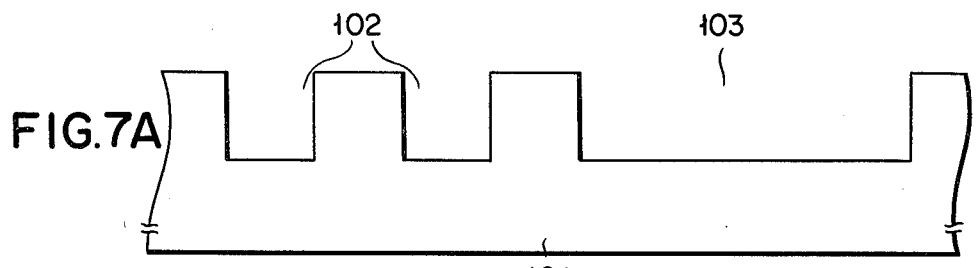
FIGS. 7A to 7E are sectional views for explaining the steps of simultaneously forming an isolation layer of narrow width and an isolation layer of wide width according to still another example of the present invention.
Figure 7B:
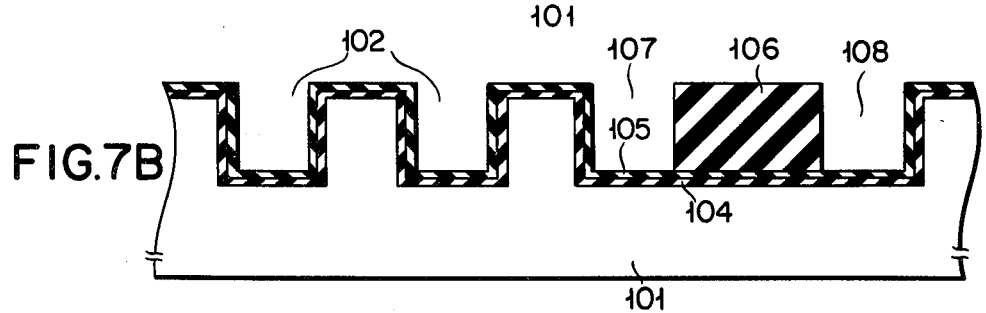

A narrow groove 102 and a wide groove 103 of 0.5 to 0.2 μm in depth, for example, were formed in the surface layer of a semiconductor substrate 101 in the same manner as in the previous examples (FIG. 7A). A pad oxide film 104 of about 100 Å thick and an oxidation-resistive insulating film of about 1,000 Å thick such as a silicon nitride film 105 were formed on the semiconductor substrate 101 (including the narrow and wide grooves 102 and 103). An insulating film such as a CVD-SiO₂ film was formed to a thickness of about 0.5 to 2.0 μm, which was substantially the same as the depth of the grooves. A CVD-SiO₂ film pattern 106 was formed in the wide groove 103 by photolithography. At this time, narrow grooves 108 were formed in the wide groove 103 (FIG. 7B).

Figure 7C:
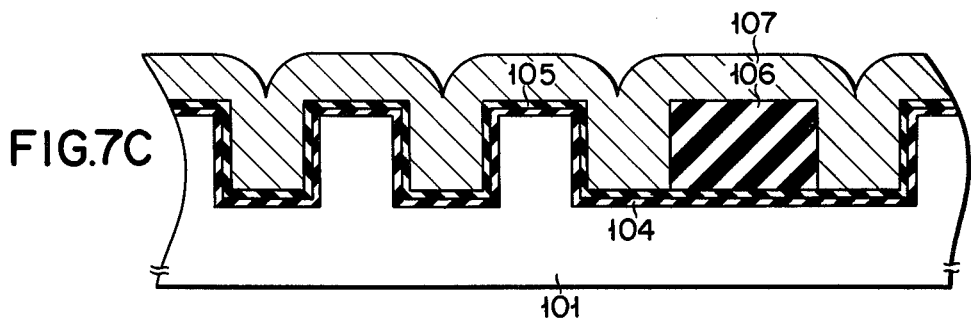

A polycrystalline silicon film 107 was then formed to cover the entire surface of the silicon nitride film 105 (FIG. 7C). The thickness of the polycrystalline silicon film 107 was determined by the widths of the grooves 102 and 108.

Figure 7D:
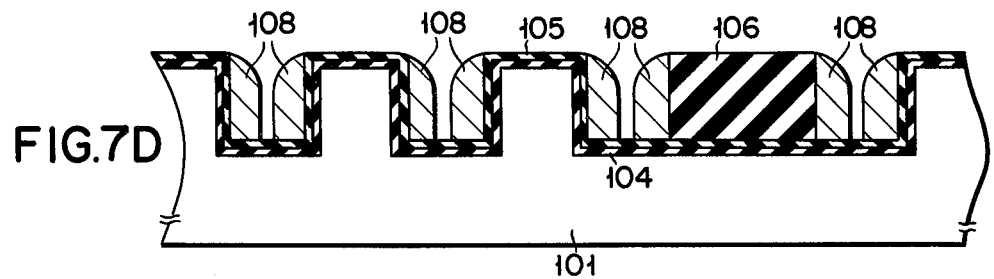

Anisotropic etching such as reactive ion etching was performed to leave the polycrystalline silicon layer 108 on the side surfaces of the grooves (FIG. 7D).

Figure 7E:
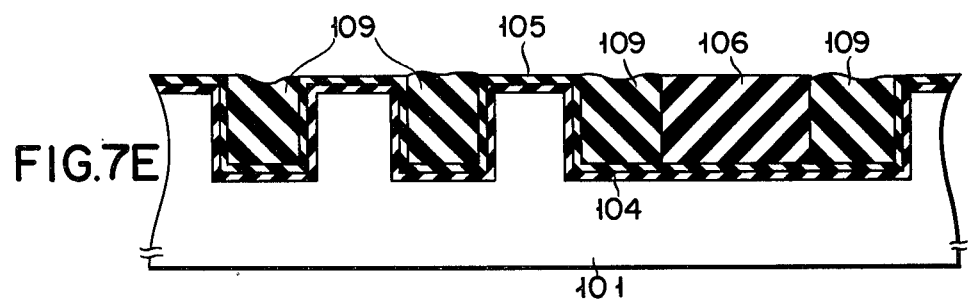

Subsequently, thermal oxidation was performed to convert the polycrystalline silicon layer 108 to a silicon oxide film 109 so that the grooves were filled therewith (FIG. 7E). Alternatively, when a thermal oxide film is used instead of the oxidation-resistive insulating film 105, wet oxidation is performed at a relatively low temperature of 700° to 900° C. after an n+-type impurity is doped so that the grooves may be thus filled. Therefore, the permeation of the oxidizing agent into the semiconductor substrate 101 can be minimized.

Examples 6 and 7 to be described below show cases wherein the present invention is applied to the manufacture of a MOS type integrated circuit which has a thin oxidation-resistive film formed only on the side wall of the groove by etching using a non-single-crystalline semiconductor film pattern as a mask.

EXAMPLE 6

Figure 8A:
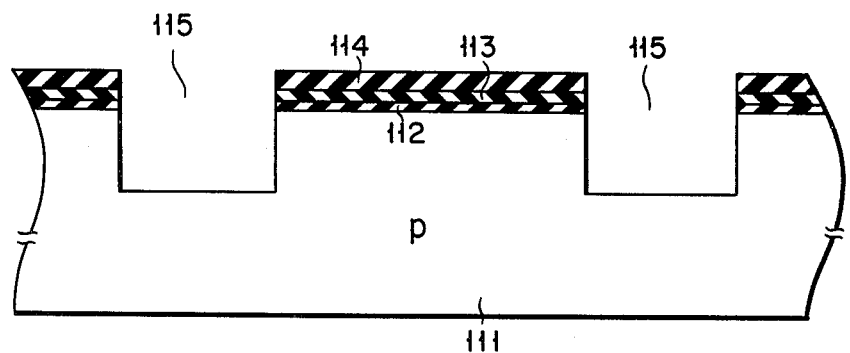
FIGS. 8A to 8E are sectional views for explaining the steps of manufacturing a semiconductor device according to still another example of the present invention when the present invention is applied to the manufacture of a MOS type integrated circuit.

A first underlying oxide film 112 of 100 Å thick was formed on a p-type silicon substrate 111 by thermal oxidation. A silicon nitride film 113 of 1,000 Å thick and an SiO₂ film 114 of 2,000 Å thick were sequentially deposited by the CVD method on the underlying oxide film 112. An opening was formed at part of these insulating films, that is, the silicon nitride film 113 and the SiO₂ film 114 by photolithography. Further, the p-type silicon substrate was etched by reactive ion etching to form a groove 115, using the SiO₂ film 114 located on the top as a mask (FIG. 8A).

Figure 8B:
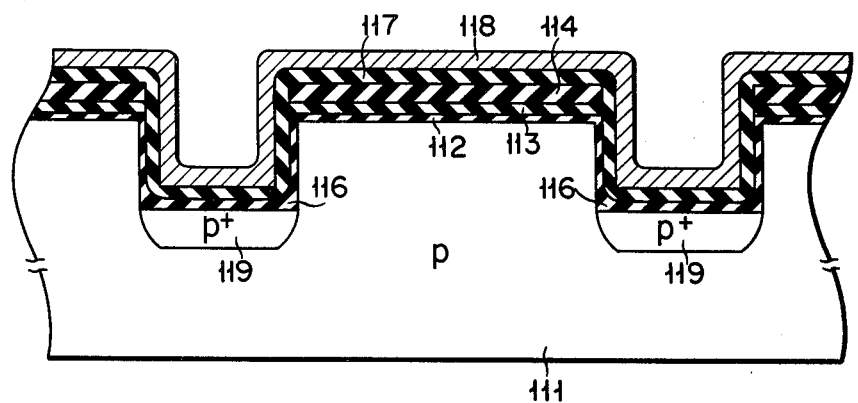

A contaminating layer (not shown) of the groove 115 was etched by reactive ion etching. Thermal oxidation was then performed to form a second underlying oxide film 116 of about 100 Å thick on the inner wall of the groove 115. A p-type impurity such as boron was ion-implanted in the silicon substrate 111 at the bottom of the groove 115 through the second underlying oxide film 116, using the SiO₂ film 114 and the silicon nitride film 113 as masks. A silicon nitride film 117 was then deposited to a thickness of 500 Å on the entire surface. A polycrystalline silicon layer 118 of about 3,000 Å thick as a material layer for a remaining pattern was deposited on the silicon nitride film 117. Thereafter, the p-type impurity doped layer was activated to diffuse boron and to form a $p^+$-type channel stopper 119 (FIG. 8B).

Figure 8C:
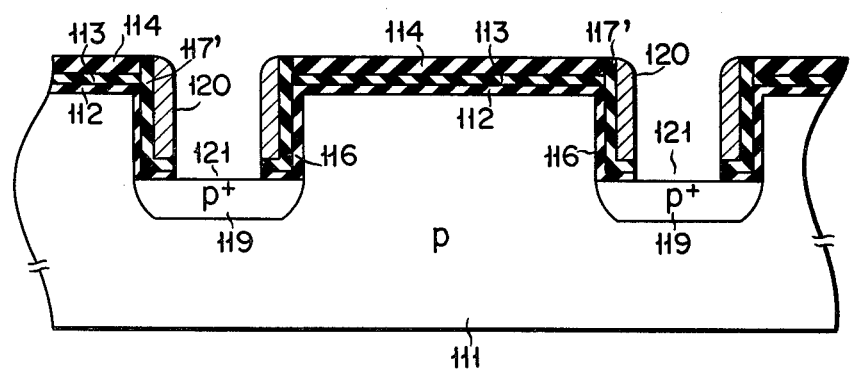

Anisotropic etching such as reactive ion etching was performed to eliminate the polycrystalline silicon layer 118 except for the polycrystalline silicon layer 118 in the groove 115. As a result, a remaining pattern 120 of the polycrystalline silicon was formed on the side wall of the groove 115 which was covered with the second underlying oxide film 116 and the silicon nitride film 117. Reactive ion etching using a different etchant from that used in the former reactive ion etching was performed to remove the exposed portion of the silicon nitride film 117 at the bottom of the groove 115. Further, the second underlying oxide film 116 under the silicon nitride film 117 was etched. At this time, since the pattern 120 remained on the side wall of the groove 115, a silicon nitride film 117' remaining on the side wall of the groove 115 was not removed and an opening 121 was formed at the bottom of the groove 115. When the silicon nitride film 117 was etched by reactive ion etching, the SiO₂ film 114 acted as the etching mask (FIG. 8C).

Figure 8D:
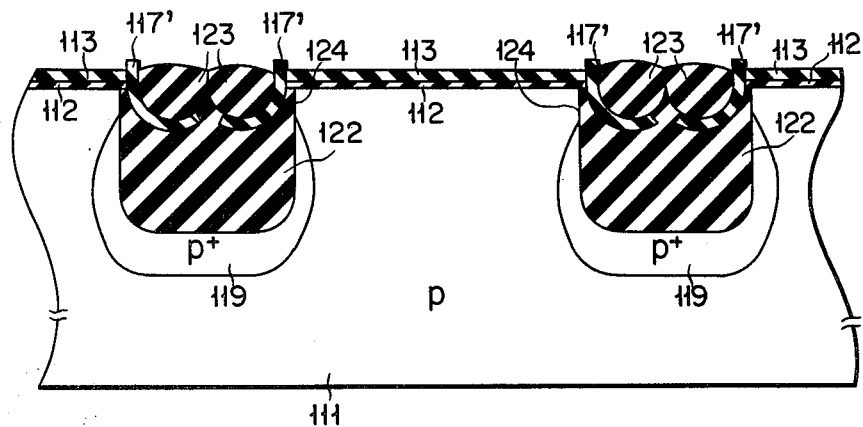

A contaminating layer (not shown) formed in reactive ion etching was removed. Further, the SiO₂ film 114 was etched by wet etching using an etchant of the ammonium fluoride solution or the like. The wafer was then thermally oxidized. At this time, the oxidizing agent entered from the opening 121 at the bottom of the groove 115. A thick oxide film 122 was then formed at the bottom of the groove and simultaneously the remaining silicon nitride film 117, was pushed upward. When the thick oxide film 122 is formed up to the surface of the groove 115, this results in the bird's beak. In this example, the oxide film 122 was therefore formed only to a certain depth of the groove 115. A shallow groove formed by this step was filled with a silicon oxide 123 of the remaining polycrystalline silicon film 120 which was pushed up by the remaining silicon nitride film 117'. Thus, an isolation layer 124 comprising the thick oxide film 122, the remaining silicon nitride film 117' and the silicon oxide 123 converted from the remaining polycrystalline silicon film fills the groove 115. The surface level of the isolation layer 124 was substantially the same as that of the silicon substrate 111 (FIG. 8D). In thermal oxidation described above, the silicon nitride film 113 was formed on the surface of the silicon substrate 111 through the underlying oxide film 112, so that the oxidation of the surface of the silicon substrate 111 was prevented.

Figure 8E:
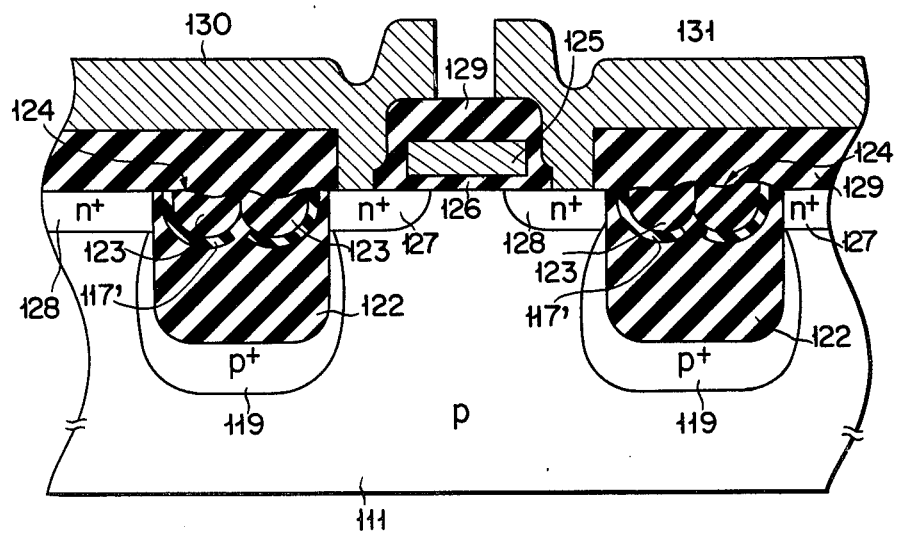

The silicon nitride film 113 and the first underlying oxide film 112 were etched to form an oxide film of about 600 to 1,000 Å thick on the p-type silicon substrate of the island shape isolated by the isolation layer 124. A p-type impurity such as boron was ion-implanted to control the threshold value. Thereafter, a gate electrode 125 comprising a polycrystalline silicon film was formed. Subsequently, the oxide film was selectively etched to form a gate oxide film 126, using the gate electrode 125 as a mask. An n-type impurity such as arsenic was ion-implanted in the entire surface to form $n^+$-type regions 127 and 128 as the source and drain. Various kinds of annealing were performed. A CVD-SiO₂ film 129 was deposited on the entire surface and contact holes were formed. Metal electrodes 130 and 131 made of aluminum or the like were deposited, thus achieving an n-channel MOS transistor (FIG. 8E).

According to this example, the silicon nitride film 117 in the groove 115 was etched, using the remaining pattern 120 formed by etching the polycrystalline silicon layer 118 by reactive ion etching. In this manner, without forming the over-hang structure made of silicon nitride film in accordance with the conventional method, the very thin silicon nitride film 117' remaining on the side wall of the groove 115 can be easily formed properly. Further, even if the groove 115 is formed in a tapered shape, the thickness of the pattern remaining on the side wall of the groove may be made large, so that the silicon nitride film 117' remaining on the side wall of the groove 115 can be properly formed. Moreover, the thickness of the remaining pattern 120 is substantially determined by the deposited thickness of the polycrystalline silicon layer 118 as the material layer for the remaining pattern. Therefore, the shape of the remaining silicon nitride film 117' may be arbitrarily controlled. In this manner, since the very thin silicon nitride film 117' remaining on the side wall of the groove 115 is properly formed, the crystal defect due to thermal strain of the silicon substrate 111 around the oxide film 122 is extremely reduced when the oxide film 122 which fills most of the groove 115 is formed by thermal oxidation. Further, the groove 115 is filled not only with the oxide film 122 formed at the time of thermal oxidation of the silicon substrate 111, but also with the remaining silicon nitride film 117', which is pushed upward, and the silicon oxide 123, which is converted from the remaining pattern 120 of the polycrystalline silicon layer. In other words, a method is adopted wherein the step between the surface of the silicon substrate 111 and the oxide film 122 deposited in a portion of the groove 115 is filled with the silicon oxide 123 of the remaining pattern. Therefore, the thermal oxidation time is shortened. Further, the occurrence of the crystal defects in the silicon substrate 111 around the groove 115 is further prevented. Oxidation which causes the formation of the bird's beak may be significantly improved, since the oxidizing agent reaches the surface of the groove 115 through the second underlying oxide film 116. Therefore, the enlargement of the oxide film by the bird's beak is prevented and the isolation layer 124 of small dimensional changes can be obtained. Further, the thickness of the silicon nitride film 113 formed on the silicon substrate 111, which greatly influences the relationship between the bird's beak and the crystal defect which both occur on the surface of the silicon substrate 111, is accurately controlled. From these points of view, a small isolation layer 124 of small dimensional changes is formed. The occurrence of the crystal defect due to thermal strain of the silicon substrate 111 around the isolation layer 124 is extremely decreased.

When the remaining pattern 120 consists of the polycrystalline silicon layer as in the above example, the remaining pattern 120 is doubled in volume by thermal oxidation. Therefore, even if the step between the silicon substrate 111 and the oxide film 122 selectively formed in the groove 115 is great, the silicon oxide 123 converted from the remaining pattern 120 fills the groove 115 sufficiently. The level of the isolation layer is thus made substantially the same as that of the silicon substrate 111.

Figure 9A:
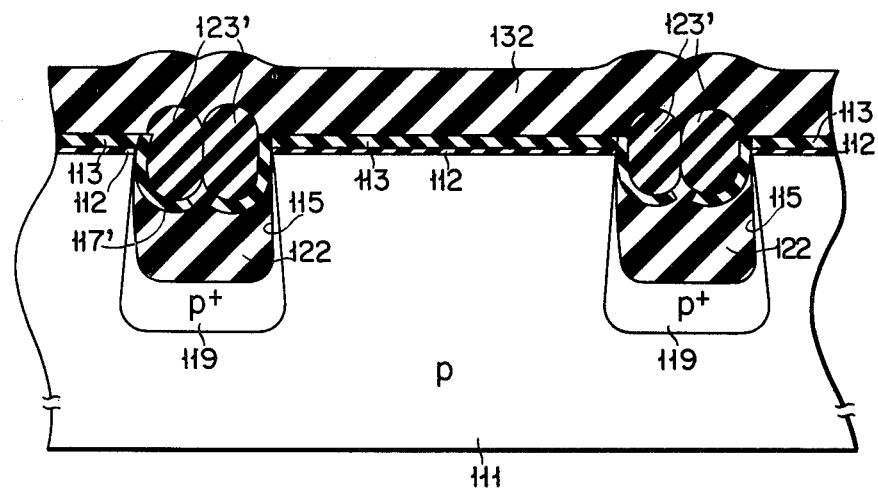
FIGS. 9A and 9B are sectional views for explaining the steps of forming the isolation layer of FIGS. 8A to 8E according to a modification of the present invention.
Figure 9B:
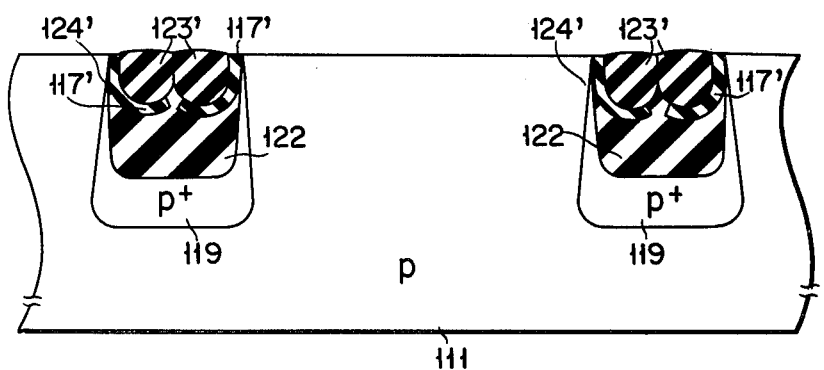

Further, in the above example, when the remaining pattern 120 consisting of the polycrystalline silicon layer is left to be thick on the side wall of the groove 115, the silicon oxide 123 may be expanded above the groove 115 since the plycrystalline silicon layer is doubled in volume by thermal oxidation. In this case, a process to be shown in FIGS. 9A and 9B may be performed. After thermal oxidation is performed, a CVD insulating film 132 (BPSG film) containing a high concentration of boron and phosphorus is formed to a thickness of about 1.0 μm on the silicon substrate 111. When annealing is performed, the BPSG film 132 flows to flaten the upper surface (FIG. 9A). Reactive ion etching is performed to etch the flat BPSG film 132. At the same time, the oxide film 123' of a convex shape is etched to form a flat isolation layer 124' (FIG. 9B). However, in fact, when the thickness of the material layer for the remaining pattern, which corresponds to the depth of the groove 115, is determined, the groove 115 is easily filled with the oxide film 122 and the silicon oxide 123 converted from the remaining pattern, thus accomplishing the flat isolation layer.

EXAMPLE 7

This example shows a case wherein the present invention is applied to the manufacture of a MOS type integrated circuit and a non-single-crystalline semiconductor film remaining in a groove is removed prior to thermal oxidation.

Figure 10A:
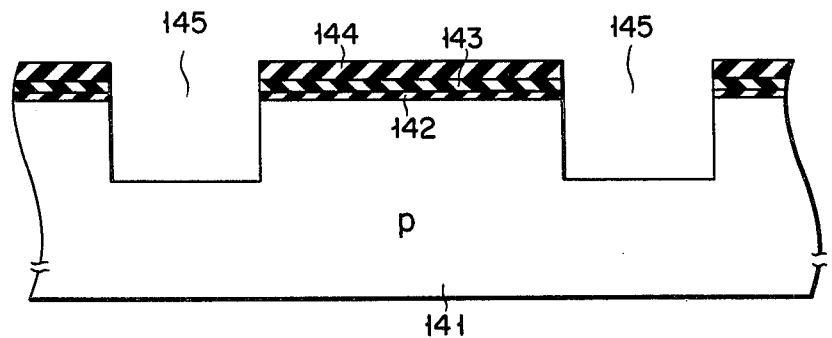
FIGS. 10A to 10G are sectional views for explaining the steps of manufacturing a semiconductor device according to still another example of the present invention when the present invention is applied to the manufacture of a MOS type integrated circuit.

A first underlying oxide film 142 of about 100 Å thick was formed on a p-type silicon substrate 141 by thermal oxidation. A silicon nitride film 143 of about 2,000 Å thick and a SiO$_2$ film 144 of about 2,000 Å thick were sequentially deposited on the first underlying oxide film 142 by the CVD method. Thereafter, a desired portion of these insulating films 144, 143 and 142 was etched by photolithography to form an opening. Part of the p-type silicon substrate was then etched by reactive ion etching to form a groove 145, using the SiO$_2$ film 144 located in the uppermost position as a mask (FIG. 10A).

Figure 10B:
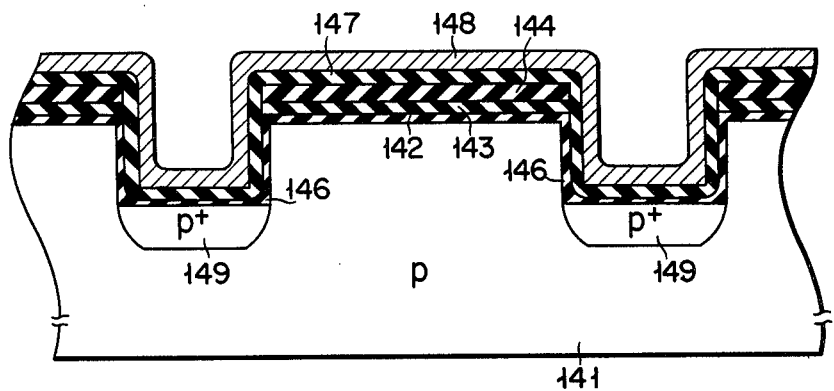

After a contaminating layer (not shown) of the groove 145 which was formed by reactive ion etching was eliminated, thermal oxidation was performed to form a second underlying oxide film 146 of about 100 Å thick on the inner wall of the groove 145. A p-type impurity such as boron was ion-implanted in the silicon substrate 141 at the bottom of the groove 145 through the second underlying oxide film 146, using the SiO$_2$ film 144 and the silicon nitride film 143 as masks. Subsequently, a silicon nitride film 147 of 500 Å thick was deposited on the entire surface. A polycrystalline silicon layer 148 of 3,000 Å thick as the material layer for the remaining pattern was deposited. The p-type impuritydoped layer was then activated to diffuse boron and to form a p$^+$-type channel stopper 149 (FIG. 10B).

Figure 10C:
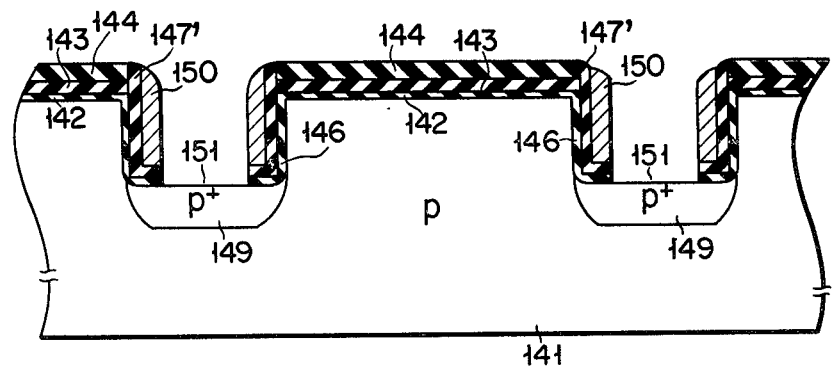

Anisotropic etching such as reactive ion etching was performed to etch the polycrystalline silicon layer 148. A remaining pattern 150 consisting of the polycrystalline silicon layer was formed on the side wall of the groove 145 which was covered with the second underlying oxide film 146 and the silicon nitride film 147. Subsequently, reactive ion etching using a different etchant from that in the previous reactive ion etching was performed to remove part of the exposed silicon nitride film 147 at the bottom of the groove 145. Further, the second underlying oxide film 146 under the silicon nitride film 147 was etched. At this time, since the pattern 150 was on the side wall of the groove 145, the silicon nitride film 147' remaining on the side wall of the groove 145 was not etched and an opening 151 was formed at the bottom of the groove 145. The SiO$_2$ film 144 on the silicon substrate 141 acted as the etching mask when the silicon nitride film 147 was etched by reactive ion etching (FIG. 10C).

Figure 10D:
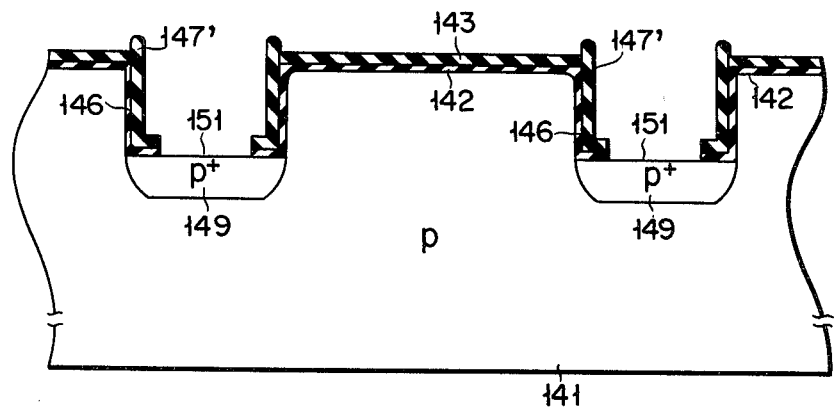
Figure 10E:
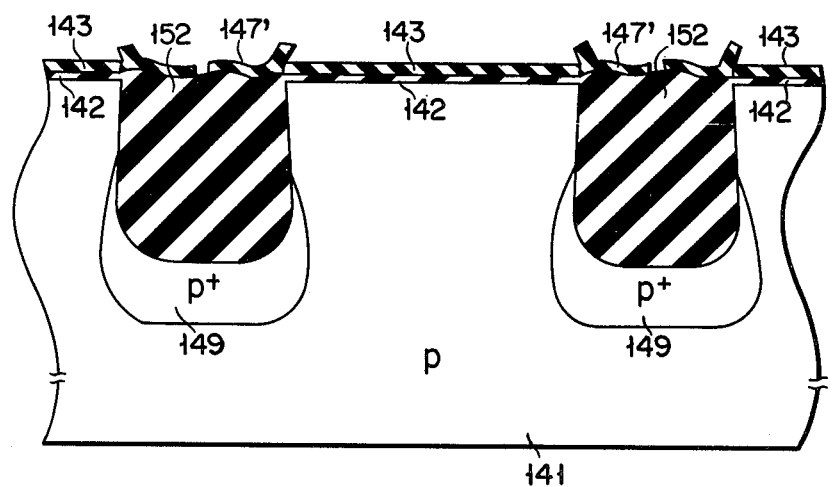
Figure 10F:
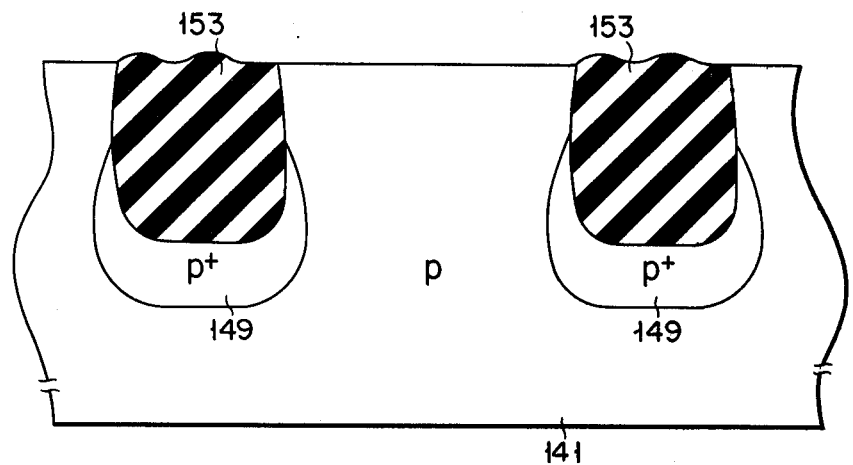

After a contaminating layer (not shown) formed by reactive ion etching was etched, the remaining pattern 150 consisting of the polycrystalline silicon layer and the SiO$_2$ film 144 were etched (FIG. 10D). Thermal oxidation was then performed. At this time, an oxidizing agent entered from the opening 151 at the bottom of the groove 145. Therefore, a thick oxide film was formed on the silicon substrate 141 at the bottom of the groove 145. Simultaneously, the oxidizing agent permeates along the second underlying film 146 under the remaining silicon nitride film 147' to form an oxide film. Along with this, the silicon nitride film 147' remaining on the side wall of the groove 145 was pushed upward. Finally, the oxide film 152 was filled in the groove 145 (FIG. 10E). Further, the silicon nitride film 143, the remaining silicon nitride film 147' and the underlying oxide film 142 on the silicon substrate 141 were etched, so that isolation layer 153, which consisted of the oxide film 152 filled in the groove 145, was formed flat with a surface level substantially the same as that of the silicon substrate 141 (FIG. 10F).

Figure 10G:
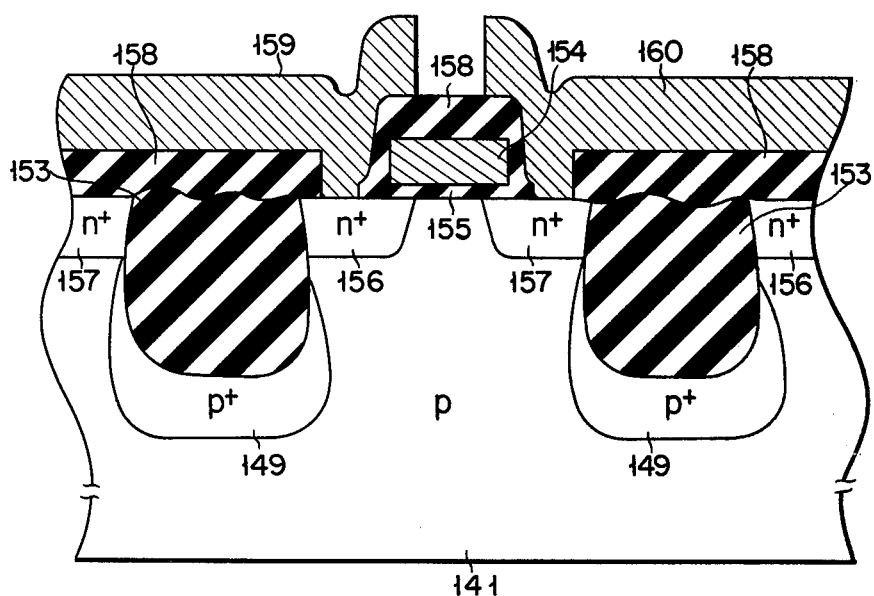

An oxide film of 600 to 1,000 Å thick was deposited on part of the p-type silicon substrate 141 of the island shape isolated by the isolation layer 153. A p-type impurity such as boron was ion-implanted to control the threshold value. A gate electrode 154 which consisted of the polycrystalline silicon layer was then formed. Subsequently, the oxide film was selectively etched, using the gate electrode 154 as a mask. An n-type impurity such as arsenic was ion-implanted in the entire surface to form n$^+$-type regions 156 and 157 as the source and drain. Various kinds of annealing were performed and a CVD-SiO$_2$ film 158 was formed on the entire surface. Further, contact holes were formed and metal electrodes 159 and 160 were deposited, thus accomplishing an n-channel MOS transistor (FIG. 10G).

According to this example, the very thin silicon nitride film 147' remaining on the side wall of the groove 145 is simply, properly formed, so that the crystal defect due to thermal strain of the silicon substrate 141 around the silicon oxide 152 filled in the groove 145 is extremely decreased. Further, the enlargement of the oxide film 152 due to the bird's beak is extremely minimized. Therefore, the isolation layer 153 of the small dimensional change is formed. The over-hang structure which is formed by the silicon nitride film in the conventional method is not required. Even without such a structure, the thick remaining silicon nitride film 147' is not removed at all, thus obtaining the proper isolation layer. Further, even if the groove 145 is formed in a tapered shape, the silicon nitride film 147' remaining on the side wall of the groove 145 is properly formed by making the remaining pattern 150 formed on the side wall of the groove 145 thick. Moreover, the thickness of the remaining pattern 150 is determined by the deposited thickness of the polycrystalline silicon layer 148 as the material layer for the remaining pattern. Therefore, the thickness of the pattern may be arbitrarily determined. Further, according to this example, the thickness of the silicon nitride film 143 on the silicon substrate 141 is controlled to be constant, since this thickness greatly influences the relationship between the bird's beak and the crystal defect. Therefore, the isolation layer 153 which substantially eliminates the bird's beak and the crystal defect may be manufactured. However, in the conventional method, over-etching is performed in order to obtain the uniform wafer when an opening is formed on the silicon nitride film at the bottom of the groove. As a result, the film thickness becomes nonuniform. However, according to the present invention, the uniform isolation layer with high precision is accomplished. In the above example, the polycrystalline silicon layer 150 can be replaced by an impurity doped or undoped CVD-SiO₂ film 150.

What is claimed is:

1. A method for manufacturing a semiconductor device comprising the steps of:
    forming at least one groove in a semiconductor substrate using a thin oxide film as a mask;
    expanding the width and depth of said groove using isotropic etching and simultaneously forming an overhang portion of said thin oxide film over the edge of said groove;
    forming a non-single-crystalline semiconductor film to cover an entire surface of said semiconductor substrate including an inner surface of said groove;
    selectively vertically etching said non-single-crystalline semiconductor film using reactive ion etching and using said overhang portion as a mask so as to leave said non-single-crystalline semiconductor film on a side wall of said groove under said overhang portion; and
    forming an oxide isolation layer in said groove by thermal oxidation.

2. A method according to claim 1, wherein said non-single-crystalline semiconductor film is a member selected from the group consisting of an undoped polycrystalline silicon film, an impurity-doped polycrystalline silicon film, an amorphous silicon film and a metal silicide film.

3. A method according to claim 1, wherein said non-single-crystalline semiconductor film is selectively etched by reactive ion etching.

4. A method according to claim 1, wherein oxidation is performed prior to the formation of said non-single-crystalline semiconductor film to form an oxide film on the inner surface of said groove.

5. A method according to claim 1, wherein said semiconductor substrate is selectively etched to form said groove, using an insulating film of a predetermined pattern as a mask.

6. A method according to claim 5, wherein said semiconductor substrate is etched by isotropic etching to form an over-hang of an insulating film pattern.

7. A method according to claim 1, wherein said non-single-crystalline semiconductor film is oxidized by the thermal oxidation to fill said groove with an oxide formed therefrom.

8. A method according to any one of claims 1 to 7, wherein an oxidation-resistive insulating film is formed to cover said semiconductor substrate including the inner surface of said groove prior to the formation of said non-single-crystalline semiconductor film.

9. A method according to claim 8, wherein said oxidation-resistive insulating film is a member selected from the group consisting of a silicon nitride film and an alumina film.

* * * * *